(12) United States Patent
Ie et al.

(10) Patent No.: US 11,352,698 B2
(45) Date of Patent: Jun. 7, 2022

(54) ATOMIC LAYER DEPOSITION APPARATUS AND METHODS OF FABRICATING SEMICONDUCTOR DEVICES USING THE SAME

(71) Applicant: SAMSUNG ELECTRONICS CO., LTD., Suwon-si (KR)

(72) Inventors: Sangyub Ie, Suwon-si (KR); Gukhyon Yon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 168 days.

(21) Appl. No.: 16/590,975

(22) Filed: Oct. 2, 2019

(65) Prior Publication Data
US 2020/0340115 A1 Oct. 29, 2020

(30) Foreign Application Priority Data

Apr. 25, 2019 (KR) .......................... 10-2019-0048613
Jul. 10, 2019 (KR) .......................... 10-2019-0083110

(51) Int. Cl.
| | |
|---|---|
| *C23C 16/455* | (2006.01) |
| *H01L 21/02* | (2006.01) |
| *H01L 21/687* | (2006.01) |
| *C23C 16/52* | (2006.01) |
| *C23C 16/48* | (2006.01) |

(52) U.S. Cl.
CPC .. *C23C 16/45544* (2013.01); *C23C 16/45527* (2013.01); *C23C 16/483* (2013.01); *C23C 16/52* (2013.01); *H01L 21/0262* (2013.01); *H01L 21/68742* (2013.01)

(58) Field of Classification Search
CPC ........ C23C 16/45544; C23C 16/45527; C23C 16/45519; C23C 16/483; C23C 16/4412; C23C 16/45563; C23C 16/52; C23C 16/54; C23C 16/56; C23C 16/45551; H01L 21/68742; H01L 21/67115; H01L 21/68764; H01L 21/68771; H01L 21/0262; B23K 26/82; B23K 26/352; B23K 2101/40
See application file for complete search history.

(56) References Cited

U.S. PATENT DOCUMENTS

| | | |
|---|---|---|
| 6,878,402 B2 | 4/2005 | Chiang et al. |
| 8,309,474 B1 | 11/2012 | Wang et al. |
| 8,405,175 B2 | 3/2013 | Moffatt |
| 9,466,483 B2 | 10/2016 | Kato et al. |
| 9,579,750 B2 | 2/2017 | Hunter et al. |

(Continued)

FOREIGN PATENT DOCUMENTS

| | | | |
|---|---|---|---|
| JP | 06-097102 A | 4/1994 | |
| JP | 09134865 A | * 5/1997 | ......... G03F 7/70358 |

(Continued)

*Primary Examiner* — Yuechuan Yu
(74) *Attorney, Agent, or Firm* — Lee IP Law, PC

(57) ABSTRACT

An atomic layer deposition (ALD) apparatus includes a light source disposed at an upper portion of a section, a wafer supporting part disposed at a lower portion of the section, and a lens pocket between the light source and the wafer supporting part, and including a frame part and a transparent panel, the lens pocket including a pocket space having sides defined by the frame part and a bottom defined by the transparent panel.

20 Claims, 35 Drawing Sheets

(56) References Cited

U.S. PATENT DOCUMENTS

| | | | |
|---|---|---|---|
| 9,873,946 B2 | 1/2018 | Haverkamp et al. | |
| 10,020,194 B2 | 7/2018 | Tian | |
| 2012/0225568 A1 | 9/2012 | Izawa et al. | |
| 2013/0087547 A1* | 4/2013 | Hunter | B23K 26/1464 |
| | | | 219/438 |
| 2016/0126119 A1 | 5/2016 | Shin et al. | |
| 2018/0366315 A1 | 12/2018 | Hane et al. | |

FOREIGN PATENT DOCUMENTS

| | | |
|---|---|---|
| JP | 11-008205 A | 1/1999 |
| JP | 2008-147429 A | 6/2008 |
| JP | 2009-064944 A | 3/2009 |
| KR | 10-2012-0106030 A | 9/2012 |

\* cited by examiner

ATOMIC LAYER DEPOSITION APPARATUS AND METHODS OF FABRICATING SEMICONDUCTOR DEVICES USING THE SAME

CROSS-REFERENCE TO RELATED APPLICATION

Korean Patent Application No. 10-2019-0048613, filed on Apr. 25, 2019, and Korean Patent Application No. 10-2019-0083110, filed on Jul. 10, 2019, in the Korean Intellectual Property Office, and entitled: "Atomic Layer Deposition Apparatus and Methods of Fabricating Semiconductor Devices Using the Same," are incorporated by reference herein in their entirety.

BACKGROUND

1. Field

Embodiments relate to atomic layer deposition apparatus and methods of fabricating semiconductor devices using the same.

2. Description of the Related Art

As the degree of integration of semiconductor devices increases and the patterns become finer, the quality of various layers formed on the wafer becomes more important. Thus, reducing defect rates can improve quality.

For semiconductor devices having large depth holes, such as VNAND channel holes and storage via holes in DRAMs, it is desired to provide uniform light energy or thermal energy over the top and bottom when forming the material layer.

SUMMARY

Embodiments are directed to an atomic layer deposition (ALD) apparatus, including a light source disposed at an upper portion of a section, a wafer supporting part disposed at a lower portion of the section, and a lens pocket between the light source and the wafer supporting part, and including a frame part and a transparent panel, the lens pocket including a pocket space having sides defined by the frame part and a bottom defined by the transparent panel.

Embodiments are also directed to an atomic layer deposition (ALD) apparatus, including a light source, a wafer stage, and a pocket module between the light source and the wafer stage, the pocket module including a lens pocket having a frame part an a transparent panel disposed below the frame part, a lower edge of the frame part being rounded to have a negative curved surface and a positive curved surface.

Embodiments are also directed to an atomic layer deposition apparatus, including a light source, a wafer stage, and a pocket module between the light source and the wafer stage, the pocket module including an upper panel having a flat surface, and a lens pocket disposed at a center of the upper panel, the lens pocket including a frame part and a transparent panel, the frame part including a hole shaped air inlet and a slit shaped air outlet each penetrating the frame part.

Embodiments are also directed to a method of fabricating a semiconductor device, including mounting a wafer on a wafer stage, aligning a first region of the wafer with a UV illumination area, and performing a first unit surface treatment process with respect to the first region of the wafer, the first unit surface treatment process including repeatedly alternating performing a UV illumination process and a Z-moving operation for moving up and down the wafer stage.

Embodiments are also directed to a method of fabricating a semiconductor device, including measuring a surface level profile of a wafer for generating a surface level correction data, calculating a wafer rotation moving value based on the surface level correction data, mounting the wafer on a wafer stage, performing a notch alignment process, rotating the wafer based on the wafer rotation moving value, aligning a first region of the wafer with a UV illumination area, and performing a first unit surface treatment process with respect to the first region of the wafer.

Embodiments are also directed to a method of fabricating a semiconductor device, including measuring a surface level profile of a wafer to generate a surface level correction data, calculating surface level correction values for each position of the wafer based on the surface level correction data, mounting the wafer on a wafer stage, aligning a first region of the wafer with a UV illumination area, aligning the first region of the wafer with the UV illumination area including moving the wafer stage up or down based on the surface level correction values of the first region of the wafer, performing a first unit surface treatment process with respect to the first region of the wafer, aligning a second region of the wafer with the UV illumination area, aligning the second region of the wafer with the UV illumination area including moving the wafer stage in a horizontal direction, and performing a second unit surface treatment process with respect to the second region of the wafer.

Embodiments are also directed to an atomic layer deposition apparatus, including a plurality of process sections radially disposed about a revolution axis, at least one of the plurality of process sections including a light source disposed at an upper portion, a wafer stage disposed at a lower portion, and a beam shaper between the light source and the wafer stage, the beam shaper to provide an illumination area on the wafer stage, the illumination area having a sector shape that becomes narrower toward the revolution axis and wider farther from the revolution axis.

Embodiments are also directed to an atomic layer deposition (ALD) apparatus, including a light source, a wafer stage, and a beam shaper between the light source and the wafer stage, the beam shaper including beam guides defining a trench through which a light irradiated from the light source passes, and a transparent panel disposed at a bottom of the trench.

Embodiments are also directed to an atomic layer deposition apparatus, including at least one deposition section and at least one purge section radially disposed about a revolution axis, the at least one deposition section including a light source, a wafer stage, and a beam shaper between the light source and the wafer stage, the beam shaper becoming narrower toward to the revolution axis and becoming wider farther away from the revolution axis.

BRIEF DESCRIPTION OF THE DRAWINGS

Features will become apparent to those of skill in the art by describing in detail example embodiments with reference to the attached drawings in which.

DETAILED DESCRIPTION

FIGS. 1A to 1H are projection top views schematically illustrating atomic layer deposition apparatuses 100A to 100H in accordance with various embodiments.

Figure 1A:
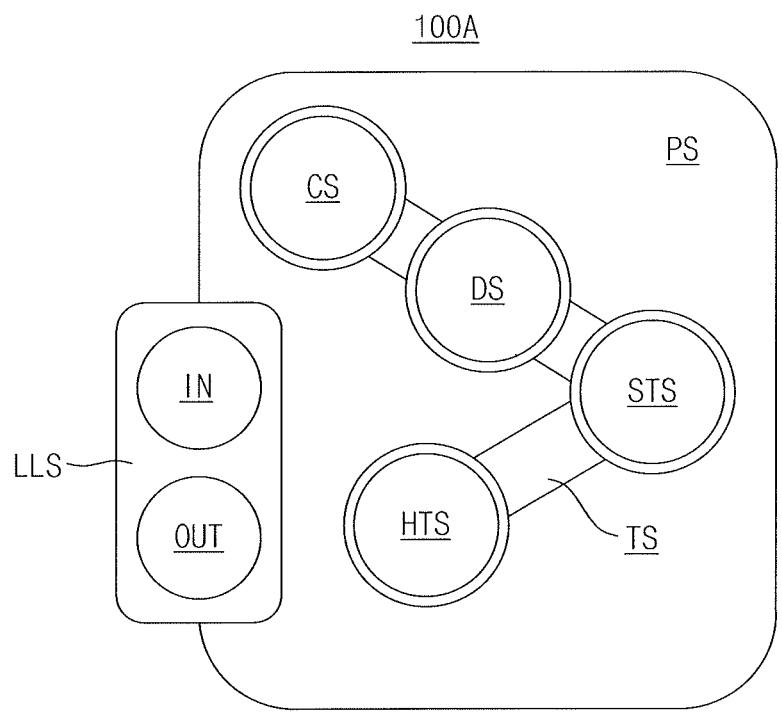
FIGS. 1A to 1H illustrate schematic projection top views of atomic layer deposition apparatuses in accordance with various embodiments.
Figure 1B:
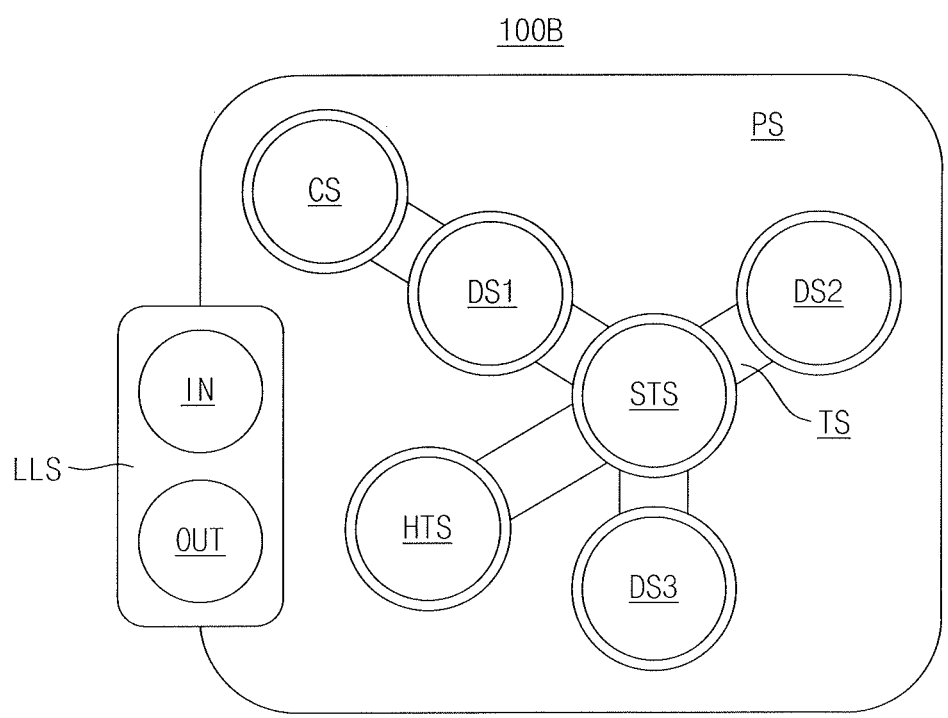
Figure 1C:
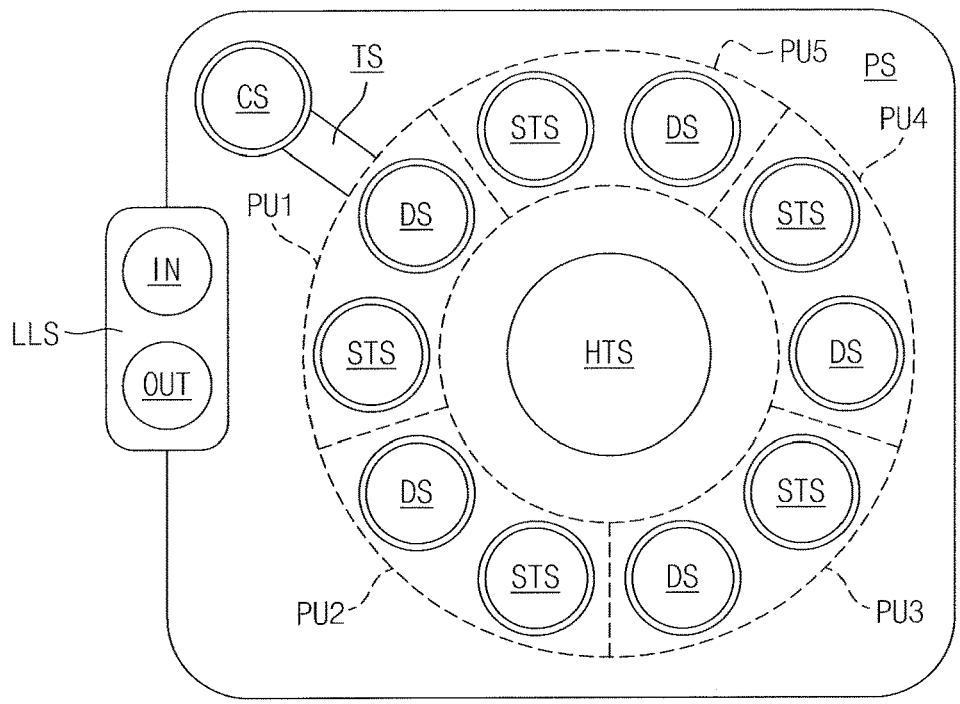

Referring to FIGS. 1A to 1C, atomic layer deposition (hereinafter, "ALD") apparatuses 100A to 100C in accordance with various embodiments may include a load-lock section LLS and a process section PS.

The load-lock section (LLS) may include a loading part IN and an unloading part OUT. Wafers to be processed may be temporarily placed at the loading part IN before being transferred from an outside into the process section PS. The wafers processed in the process section PS may be temporarily placed at the unloading part OUT before being transferred to the outside. The load-lock section LLS may seal the interior and adjust a vacuum degree before transferring the wafer to the process section PS and to the outside.

Referring to FIG. 1A, the process section PS of the ALD apparatus 100A in accordance with an embodiment may include a cleaning section CS, a deposition section DS, a surface treatment section STS, a heat treatment section HTS, and a transport section TS. The transfer section TS may transfer the wafers to the cleaning section CS, the deposition section DS, the surface treatment section STS, and the heat treatment section HTS.

The wafer placed on the loading part IN of the load-lock section LLS may be transferred to the cleaning section CS. A cleaning process for cleaning a surface of the wafer may be performed in the cleaning section CS. For example, the cleaning process may include irradiating the surface of the wafer with an ion beam or the like to remove foreign substances or the like existing on the surface of the wafer. The cleaned wafer may be transferred to the deposition section DS through the transfer section TS. A deposition process such as ALD may be performed to form a material layer on the wafer in the deposition section DS. The deposition process may include forming a material layer on the wafer that includes at least one of polycrystalline silicon layer, silicon oxide layer, silicon nitride layer, hafnium oxide layer, various inorganic compounds, or metal compounds. The wafer on which the material layer is formed may be transferred to the surface treatment section STS. In the surface treatment section STS, the material layer on the wafer may be surface treated. For example, foreign substances, defective elements, adsorbent materials, and etc., inside and on the surface of the material layer may be removed. Thus, the material layer may be purified and densified. The wafer on which the surface treatment process has been performed may be transferred to the heat treatment section HTS through the transfer section TS. In the heat treatment section HTS, the material layer on the wafer may be stoichiometrically stabilized by thermal energy. In the heat treatment section HTS, the material layer of the wafer may receive activation energy by laser and/or heat. Thus, the heat treatment section HTS may include a laser irradiation system and/or a heating system. In an embodiment, the wafer may reciprocate in the deposition section DS and the surface treatment section STS a plurality of times. For example, the deposition process and the surface treatment processes may be repeatedly performed on the material layer. The cleaning section CS, the deposition section DS, the surface treatment section STS, and the heat treatment section HTS may each independently adjust the vacuum level. Thus, the cleaning section CS, the deposition section DS, the surface treatment section STS, and the heat treatment section HTS may independently have a vacuum pump and an exhaust port.

Referring to FIG. 1B, a process section PS of the ALD apparatus 100B in accordance with an embodiment may include a cleaning section CS, a plurality of deposition sections DS1 to DS3, a surface processing section STS, a heat treatment section HTS, and a transport section TS. Compared to the process section PS described with reference to FIG. 1A, the process section PS may include a plurality of deposition sections DS1 to DS3. For example, the deposition sections DS1 to DS3 may include a first deposition section DS1, a second deposition section DS2, and a third deposition section DS3. Deposition processes for forming independent material layers in the first to third deposition sections DS1 to DS3 may be performed, respectively. A first deposition process for depositing a first material layer on the wafer may be performed in the first deposition section DS1, and a second deposition process for depositing a second material layer on the wafer may be performed in the second deposition section DS2, and a third deposition process for depositing a third material layer on the wafer may be performed in the third deposition section DS3. In the surface treatment section STS, each of the first to third material layers may be surface-treated independently. For example, the first deposition process may be performed within the first deposition section DS1 to deposit the first material layer on the wafer. The wafer on which the first material layer has been deposited may be transferred to the surface treatment section STS. In the surface treatment section STS, the first material layer on the wafer may be purified and densified by a first surface treatment process. The wafer on which the first surface treatment process has been performed may be transferred to the second deposition section DS2. In the second deposition section DS2, the second deposition process may be performed to deposit the second material layer on the first material layer of the wafer. The wafer on which the second material layer has been deposited may be transported back to the surface treatment section STS. In the surface treatment section STS, the second material layer on the wafer may be purified and densified by a second surface treatment process. The wafer on which the second surface treatment process has been performed may be transferred to the third deposition section DS3. In the third deposition section DS3, the third deposition process may be performed to deposit the third material layer on the second material layer of the wafer. The wafer on which the third material layer has been deposited may be transported back to the surface treatment section STS. In the surface treatment section STS, the third material layer on the wafer may be purified and densified by a third surface treatment process. The wafer on which the third surface treatment process has been performed may be transferred to the heat treatment section HTS. In the heat treatment section HTS, a heat treatment process is performed so that the first to third material layers on the wafer may be stoichiometrically bonded and stabilized by diffusion and the like. In an embodiment, the process section PS may further include additional deposition sections, and additional deposition processes and surface treatment processes may be further performed. In another embodiment the third deposition section DS3 may be omitted. For example, the third deposition process may be omitted, or the third deposition process may be performed in the first or second deposition sections DS1 or DS2.

Referring to FIG. 1C, the process section PS of the ALD apparatus 100C in accordance with an embodiment may include a cleaning section CS, a plurality of process units PU1 to PU5 arranged in a disk shape or ring, and a heat treatment section HTS at the center. The process units PU1 to PU5 may have a deposition section DS and a surface treatment section STS, respectively. In other embodiments, the process section PS may have at least two of the plurality of process units PU1 to PU5. The heat treatment section HIS may heat all of the processed wafers in the plurality of process units PU1 PU5. For example, the heat treatment section HTS may process a single wafer or heat treat a plurality of wafers at the same time. The plurality of process units PU1 to PU5 may rotate clockwise or counterclockwise. The transfer section TS between the process units PU1 to PU5 and the heat treatment section HTS has been omitted for clarity. Elements not described in FIGS. 1B and 1C (e.g., as the load-lock section LLS, the cleaning section CS, the transport section TS, etc.) may be understood with reference to FIG. 1A.

Figure 1D:
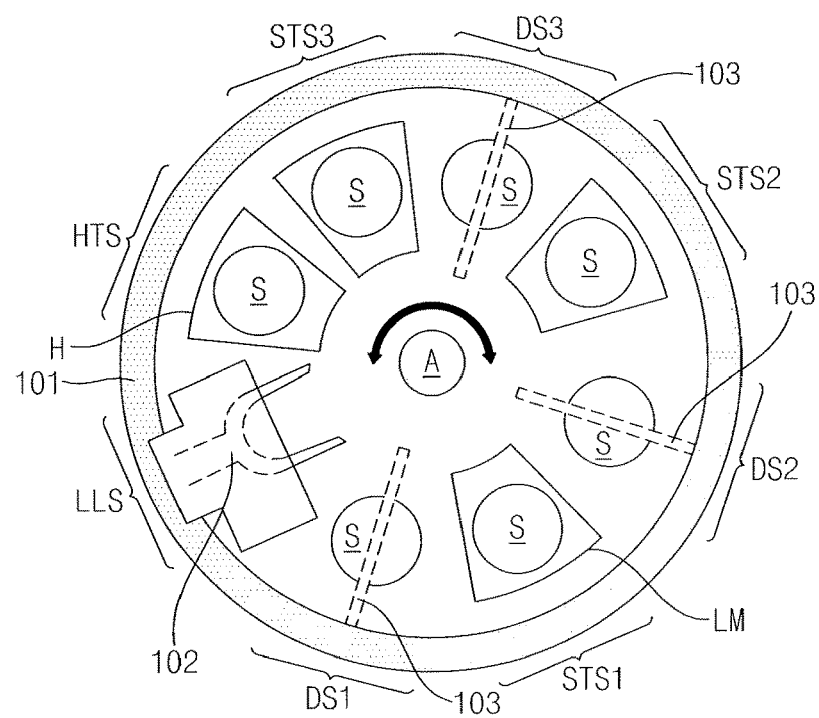

Referring to FIG. 1D, an ALD system 100D in accordance with an embodiment may include a load-lock section LLS, a plurality of deposition sections DS1 to DS3, a plurality of surface treatment sections STS1 to STS3, and a heat treatment section HTS. The load-lock section LLS may include a transfer arm 102 to transfer wafers. The transfer arm 102 may transfer the wafers from the outside onto a wafer stage S or transfer the wafers from the wafer stage S to the outside.

Deposition processes may be performed in the plurality of deposition sections DS1 to DS3. For example, source gases or reaction gases may be supplied into the deposition sections DS1 to DS3 through a gas supply pipe 103, whereby a material layer may be deposited on the wafer on the wafer stage S.

Surface treatment processes may be performed in the plurality of surface treatment sections STS1 to STS3. For example, material layers deposited in the deposition sections DS1 to DS3 may be surface treated.

The material layers may be heat treated in the heat treatment section HTS. The heat treatment section STS may include a heater for heating the wafer. In an embodiment, the heater may include a UV light source.

The wafer stages S may be arranged radially to be able to revolve within the housing 101 about the revolution axis A. For example, the wafer stages S may sequentially circulate the load-lock section LLS, the plurality of deposition sections DS1 to DS3, the plurality of surface treatment sections STS1 the STS3, and the heat treatment section HIS. The wafers on the wafer stage S may be sequentially processed by circulating through the plurality of deposition sections DS1 to DS3, the plurality of surface treatment sections STS1 to STS3, and the heat treatment section HTS.

In an embodiment, the ALD apparatus 100D may include one or more of the deposition sections DS1 to DS3 and one or more of the surface processing sections STS1 to STS3. For example, the ALD apparatus 100D may include one load-lock section LLS, two of the deposition sections DS1 to DS3, two of surface treatment sections STS1 to STS3, and one heat treatment section HTS. In an embodiment, the ALD apparatus 100D may have four or more deposition sections DSx and four or more surface treatment sections STSx. In an embodiment, ALD apparatus 100D may have the same number of deposition sections DSx and surface treatment sections STSx.

Figure 1E:
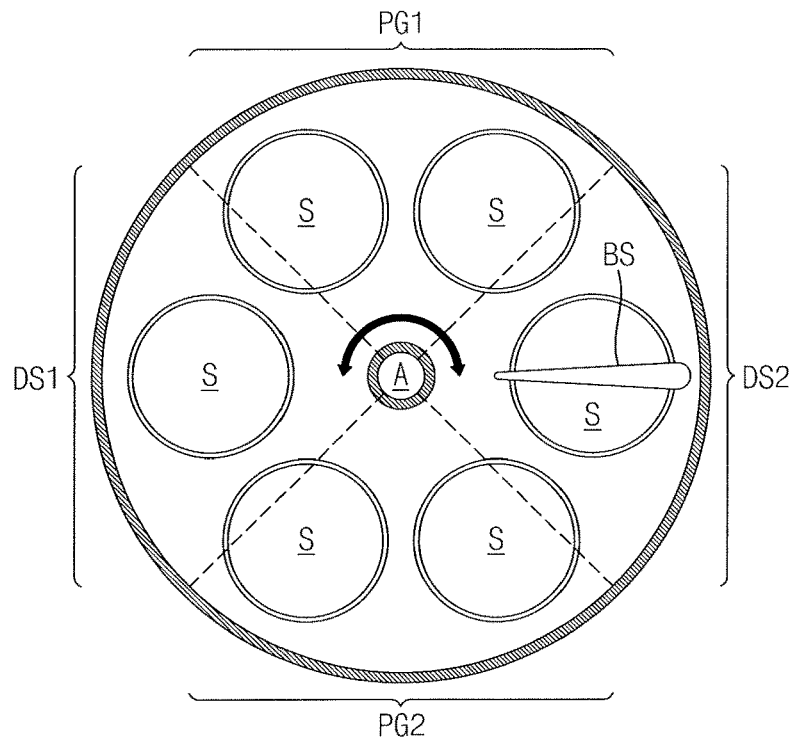

Referring to FIG. 1E, an ALD system 100E in accordance with an embodiment may include a plurality of wafer stages S and a plurality of process sections DS1, DS2, PG1, and PG2 radially disposed about a revolution axis A, and at least one of the plurality of process sections DS1, DS2, PG1, and PG2 may include a beam shaper BS. For example, the ALD apparatus 100E may include a first deposition section DS1, a first purge section PG2, a second deposition section DS2, and a second purge section PG2 arranged in a clockwise direction. In an embodiment, a surface treatment process may be performed in the deposition sections DS1 and DS2. In an embodiment, the ALD apparatus 100E may include more deposition sections, purge sections, or heat treatment sections, etc., depending on processes. The beam shaper BS may be disposed in at least one of the first deposition section DS1 or the second deposition section DS2. The length in the longitudinal direction of the beam shaper BS may be greater than a diameter of the wafer stage S or a diameter of the wafer on the wafer stage S. The wafer stages S may revolve in a clockwise or counterclockwise direction (see arrows). For example, the wafer stages S may sequentially pass through the plurality of process sections DS1, DS2, PG1, and PG2. When the wafers on the wafer stage S pass through the respective process sections DS1, DS2, PG1, and PG2, various processes may be performed. For example, the first deposition process, the first purge process, the second deposition process and the surface treatment process, and the second purge process may be sequentially performed. In an embodiment, the second deposition process and the surface treatment process may be performed simultaneously in the second deposition section DS2. The second deposition process may include forming a second material layer on a first material layer formed by the first deposition process, or oxidizing or nitriding the first material layer. The surface treatment process may include irradiating UV light to the material layers on a surface of the wafer on the wafer stage S using the beam shaper BS. The beam shaper BS may scan the wafer surface on the wafer stage S in the second deposition section DS2. In another implementation, the surface of the wafer on the wafer stage S in the second deposition section DS2 may be scanned by the beam shaper BS by the revolution of the wafer stages S.

Figure 1F:
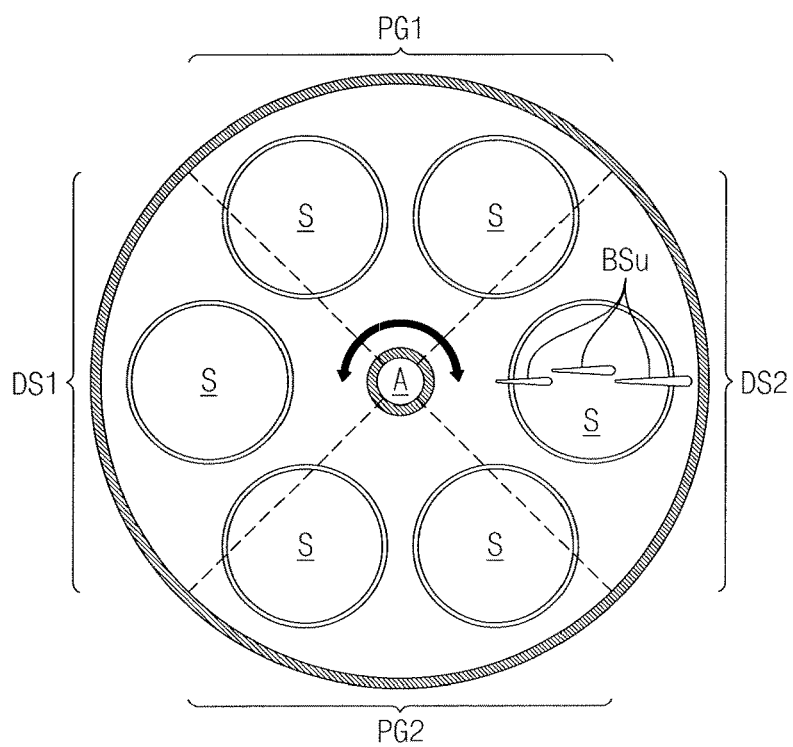

Referring to FIG. 1F, an ALD apparatus 100F in accordance with an embodiment may include a plurality of wafer stages S arranged radially around the revolution axis A, and a plurality of process sections DS1, DS2, PG1, and PG2, and at least one of the plurality of process sections DS1, DS2, PG1, and PG2 may include a plurality of unit beam shapers BSu. The plurality of unit beam shapers BSu may be used while separating the wafer stage S into a plurality of diameters. For example, the plurality of unit beam shapers BSu may have a number of separate and spaced configurations and arrangements, as compared to the beam shaper BS of FIG. 1E.

Figure 1G:
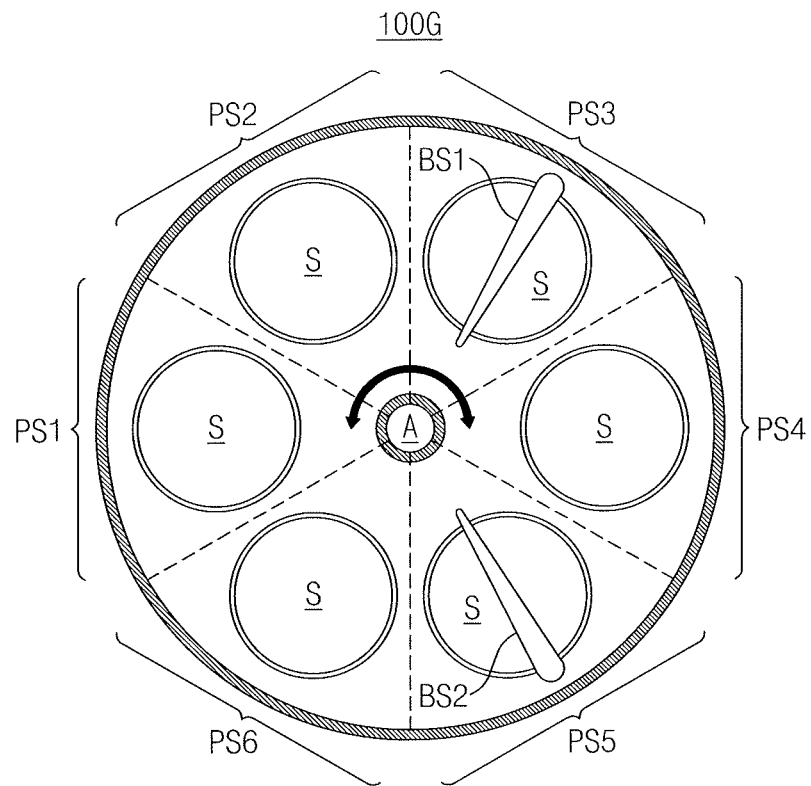

Referring to FIG. 1G, an ALD apparatus 100G in accordance with an embodiment may include beam shapers BS1 and BS2 disposed at least two of a plurality of process sections PS1 to PS6. The plurality of process sections PS1 to PS6 may each include one of a deposition section, a purge section, a surface treatment section, or a heat treatment section. A length in the longitudinal direction of the beam shaper BS1 or BS2 may be greater than a diameter of the wafer stage S or a diameter of the wafer on the wafer stage S. The wafer stages S may revolve in a clockwise or counterclockwise direction (see arrow). For example, a first deposition process may be performed in the first process section PS1, a first purge process may be performed in the second process section PS2, a second deposition process and a surface treatment process may be performed in the third process section PS3, a second purge process may be performed in the fourth process section PS4, a third deposition process or a heat treatment process may be performed in the fifth process section PS5, and a third purge process or a wafer transfer process may be performed in the sixth process section PS6. The third purge process may include a cooling process. The first beam shaper BS1 may have a UV light illumination area of a first shape or a configuration for irradiating UV light with a first energy, and the second beam shaper BS2 may have a UV illumination area having a second shape or a configuration for irradiating UV light with a second energy. For example, the first shape and the second shape may be different from each other, and/or the first energy and the second energy may be different from each other. Therefore, the UV illumination processes of different shapes and/or energies may be performed in the third process section PS3 and the fifth process section PS5. In an embodiment, with further reference to FIG. 1F, at least one of the first beam shaper BS1 and the second beam shaper BS2 may be replaced by a plurality of unit beam shapers BSu. For example, the ALD apparatus 100G may include the beam shaper BS and the unit beam shapers BSu to be separated.

Figure 1H:
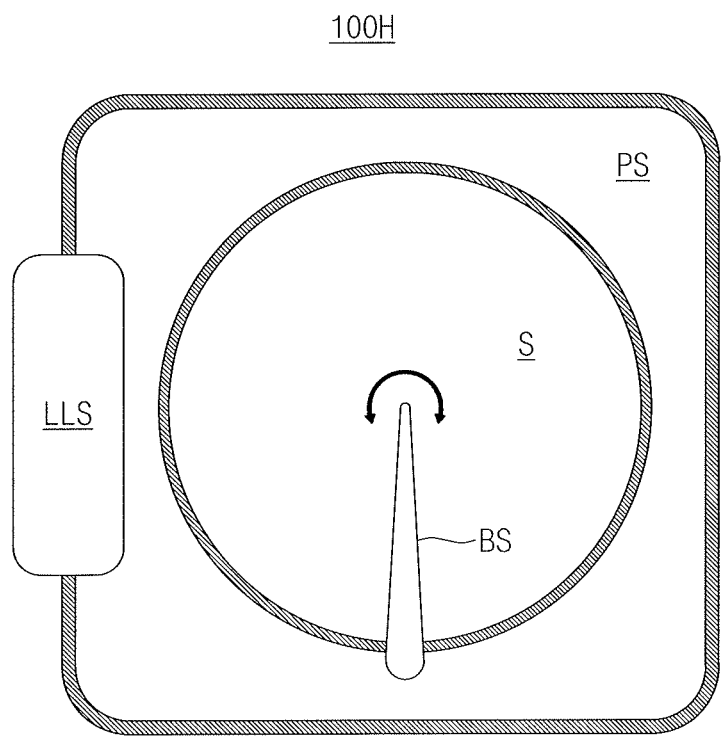

Referring to FIG. 1H, an ALD apparatus 100H in accordance with an embodiment may include a load-lock section LLS and a process section having a single wafer stage S and a single beam shaper BS. The wafer stage S may rotate clockwise or counterclockwise, as indicated using arrows. The longitudinal length of the beam shaper BS may be smaller than the diameter of the wafer on the wafer stage S or the wafer stage S, and greater than the radius (half of the diameter). For example, the length in the longitudinal direction of the beam shaper BS may be slightly greater than the radius of the wafer on the wafer stage S or the wafer stage S. Thus, as the wafer stage S rotates, the beam shaper BS may scan the entire region of the wafer on the wafer stage S. As the UV illumination area provided by the beam shaper BS decreases, the uniformity of the light provided thereby may improve. Therefore, the process uniformity may be improved because the light energy uniformity may be better than when the length in the longitudinal direction of the beam shaper BS corresponds to the diameter of the wafer or the wafer stage S.

Figure 2:
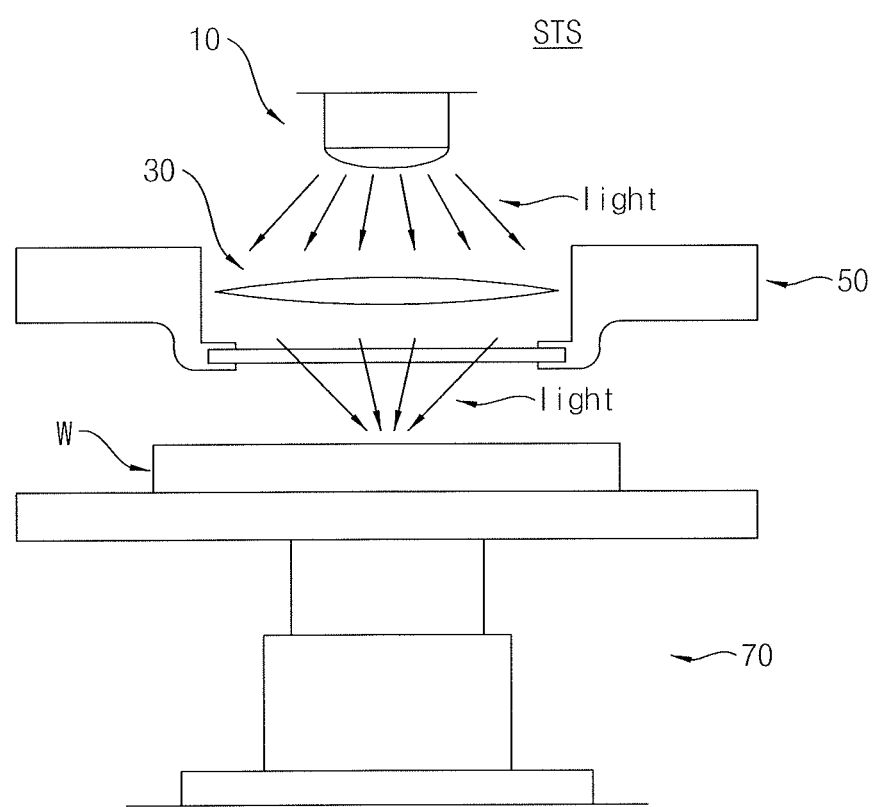
FIG. 2 illustrates a projection sectional view schematically showing a configuration of a surface treatment section of an atomic layer deposition apparatuses in accordance with various embodiments.

FIG. 2 is a sectional view schematically showing the configuration of a surface treatment section STS of the ALD apparatuses 100A to 100G in accordance with various embodiments.

Referring to FIG. 2, a surface treatment section STS in accordance with an embodiment may include a light source 10, a pocket module 50, and a wafer supporting part 70. The light source 10 may be disposed on an upper portion of the interior of the surface treatment section STS. The wafer supporting part 70 may be disposed a lower portion of the interior of the surface treatment section STS. The pocket module 50 may be between the light source 10 and the wafer supporting part 70. The surface treatment section STS may further include a lens 30 for performing a surface treatment process. In an embodiment, the lens 30 may be disposed on/in the pocket module 50 in the surface treatment section STS. A wafer W may be mounted on the wafer supporting part 70. The light source 10 may be a laser and may generate light such as a UV (ultraviolet) and emit the light toward the lens 30 in the pocket module 50. In an embodiment, the light source 10 may include a collimator and/or a telecentric lens to illuminate parallel straight-line light to have an infinite focus. The arrows exemplarily illustrate the direction of light travel. The light generated in the light source 10 may be collected by the lens 30 and focused onto the wafer W. The pocket module 50 may be located between the lens 30 and the wafer supporting part 70 to spatially and physically separate the interior of the surface treatment section STS.

Figure 3A:
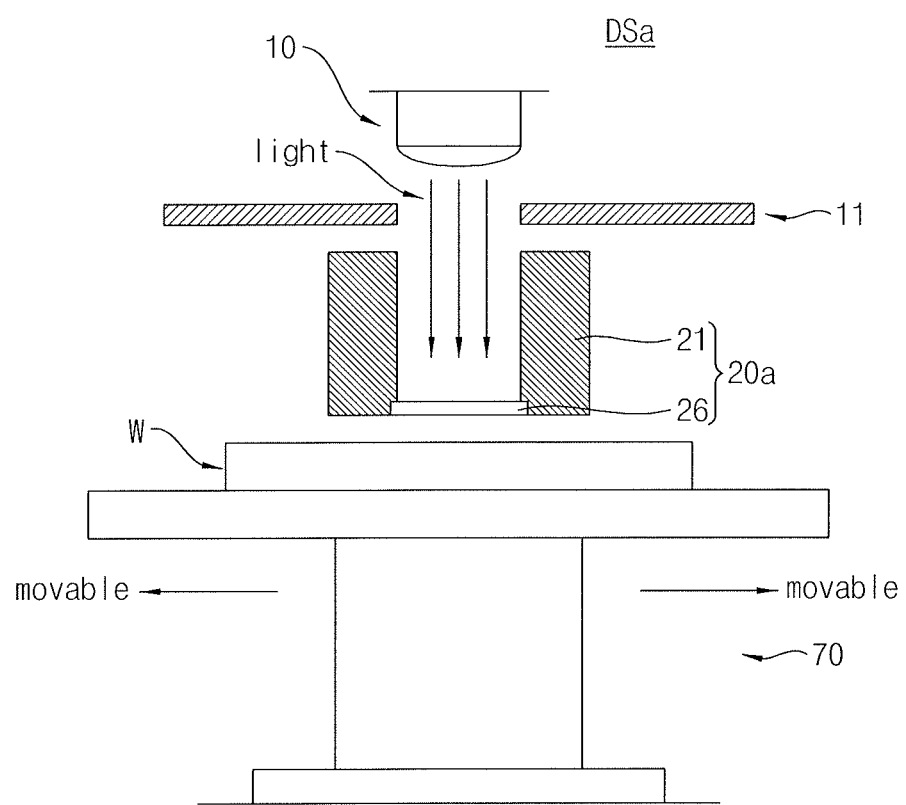
FIGS. 3A to 3C illustrate projective cross-sectional views schematically showing deposition sections of atomic layer deposition apparatuses in accordance with various embodiments.
Figure 3B:
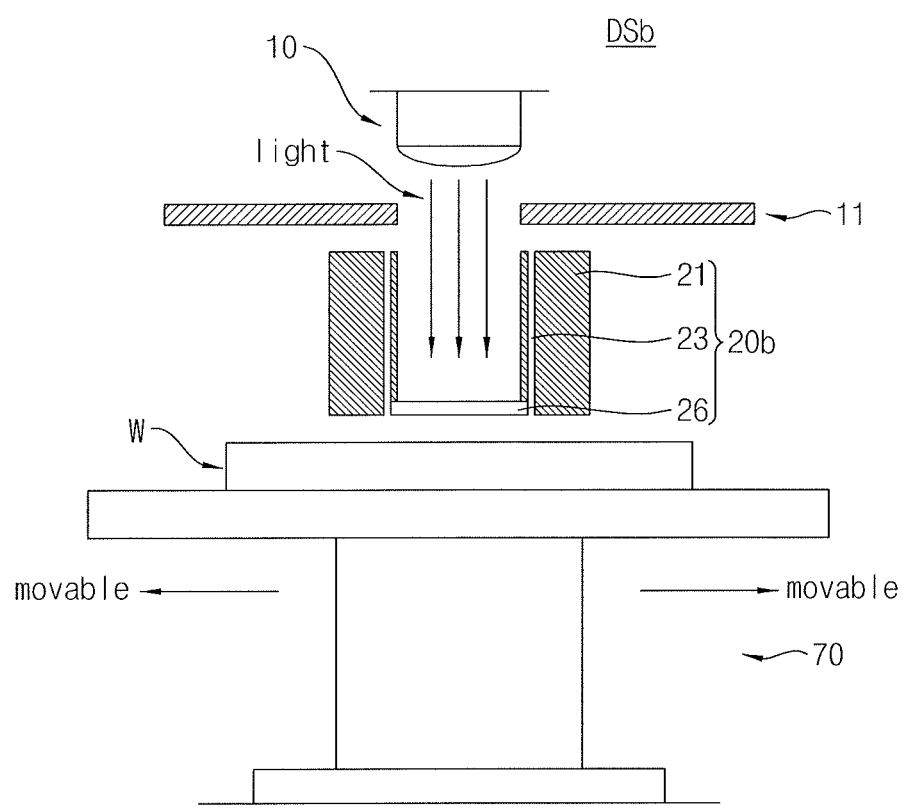
Figure 3C:
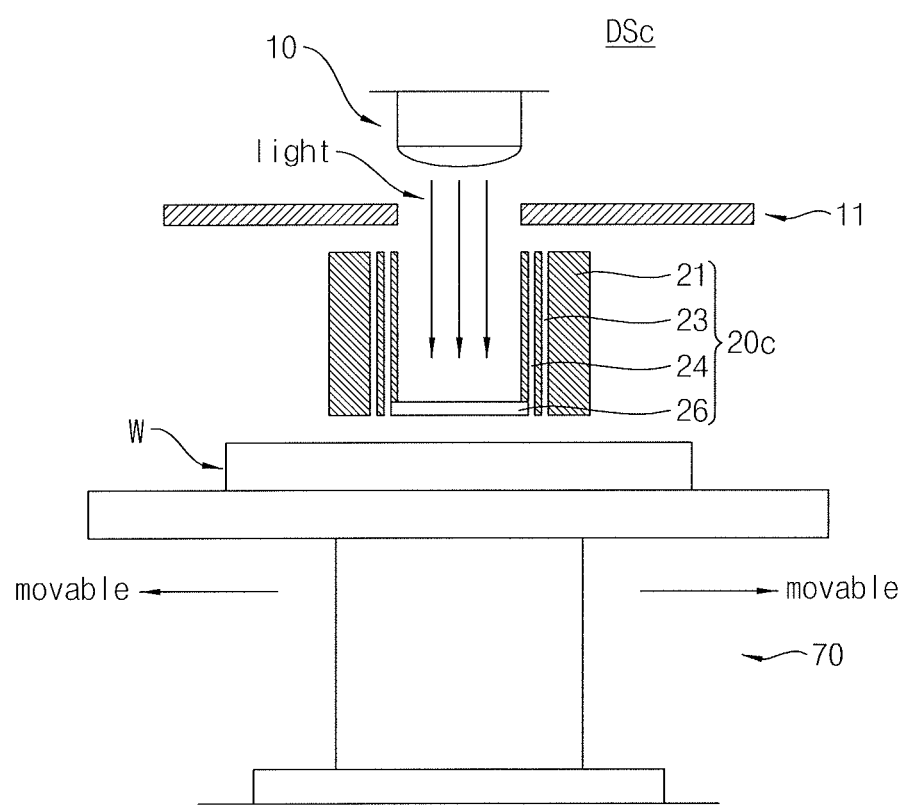

FIGS. 3A to 3C are projective cross-sectional views schematically showing deposition sections DSa to DSc of the ALD apparatuses 100A to 100H in accordance with various embodiments.

Referring to FIG. 3A, a deposition section DSa in accordance with an embodiment may include a light source 10, an aperture 11, a beam shaper 20a, and a wafer supporting part 70. The aperture 11 may selectively pass light generated from the light source 10. The beam shaper 20a may include beam guides 21 on both sides and a transparent panel 26 in the center. The beam guides 21 may guide the light passing through the aperture 11 to the surface of the wafer W on the wafer supporting part 70. The beam guides 21 may have a fence shape or a dam shape. The transparent panel 26 may include a transparent material such as quartz or sapphire ($Al_2O_3$). Thus, the light guided by the beam guides 21 may be transmitted through the transparent panel 26 and provided on the surface of the wafer W on the wafer supporting part 70. The wafer supporting part 70 may be movable in a horizontal direction.

Referring to FIG. 3B, a deposition section DSb in accordance with an embodiment may include a light source 10, an aperture 11, a beam shaper 20b, and a wafer supporting part 70. The beam shaper 20b may include a beam guide 21, a gas pipe 23, and a transparent panel 26. The gas pipe 23 may transfer a reaction gas supplied to the wafer stage S, that is, the surface of the wafer W.

Referring to FIG. 3C, a deposition section DSc in accordance with an embodiment may include a light source 10, an aperture 11, a beam shaper 20b, and a wafer supporting part 70. The beam shaper 20b may include a beam guide 21, a gas pipe 23, an air pipe 24, and a transparent panel 26. The air pipe 24 may deliver air or gas to the surface of the wafer W. For example, the air or gas may include an inert gas such as argon (Ar).

The wafer supporting part 70 of FIGS. 3A to 3C may be movable. For example, with further reference to FIGS. 1A to 1H, the wafer supporting part 70 may revolve and rotate.

FIGS. 4A to 4E are perspective views schematically illustrating the light sources 10a to 10e of the surface treatment sections STS and/or the deposition sections DS of the ALD apparatuses 100A to 100H in accordance with various embodiments.

Figure 4A:
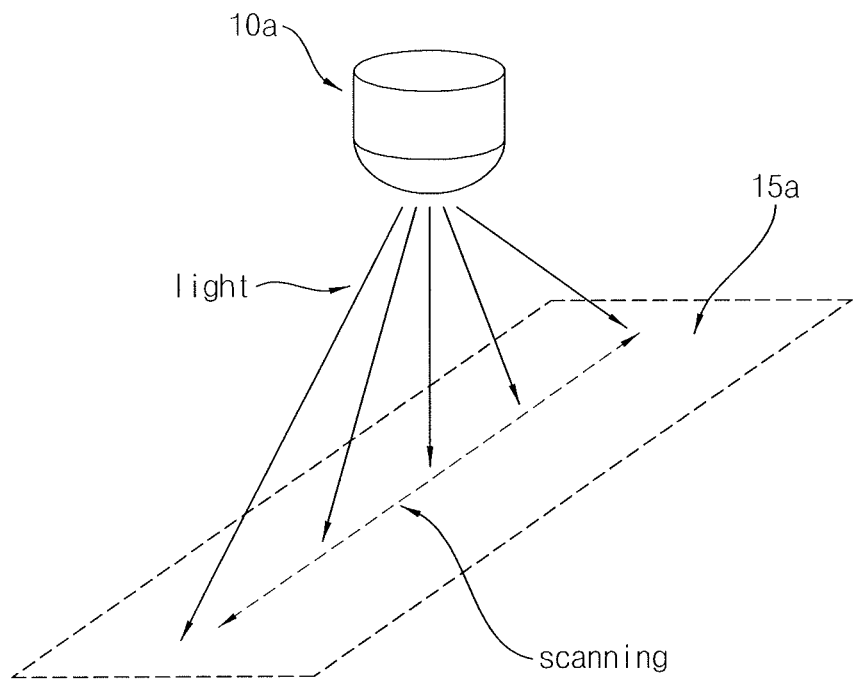
FIGS. 4A to 4E illustrate schematic perspective views of the light sources of the surface treatment sections and/or the deposition sections of atomic layer deposition apparatuses in accordance with various embodiments.

Referring to FIG. 4A, the deposition sections DS and/or the surface treatment sections STS of the ALD apparatuses 100A to 100H may have a point-type light source 10a. The point type light source 10a may be a laser and may generate UV light. The point type light source 10a may perform an optical reciprocating scanning operation in one direction, for example, a direction indicated by a dotted arrow. In some embodiments, the illumination area 15a provided by the point type light source 10a may have a bar-shape or an elongated rectangular shape.

Figure 4B:
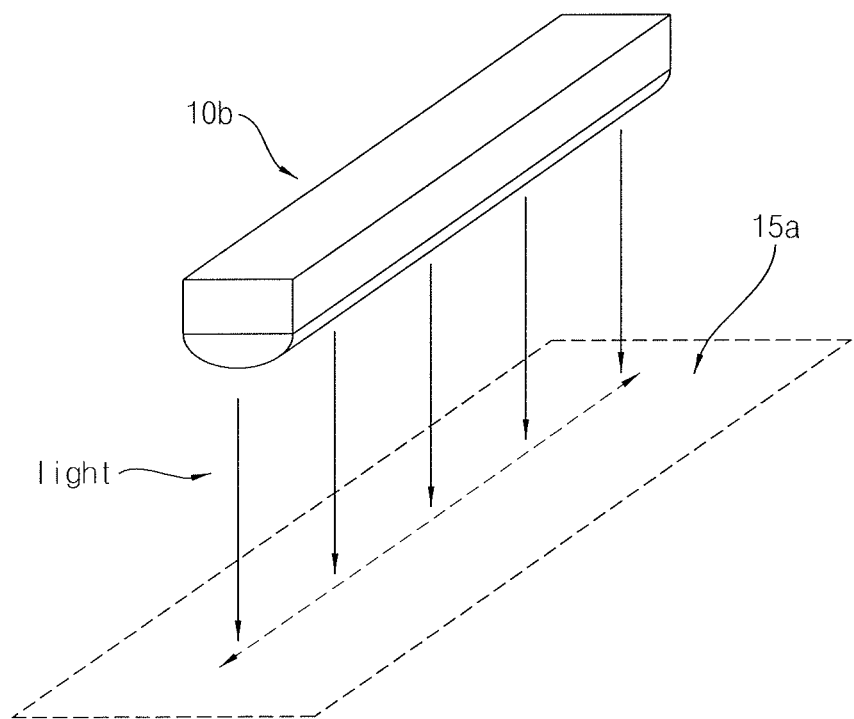

Referring to FIG. 4B, the deposition sections DS and/or the surface treatment sections STS of the ALD apparatuses 100A to 100H may have a bar-shape light source 10b. For example, the bar-shape light source 10b may be an elongated rectangular shaped light source. The illumination area 15a provided by the bar-shape light source 10b may also have a bar-shape.

Figure 4C:
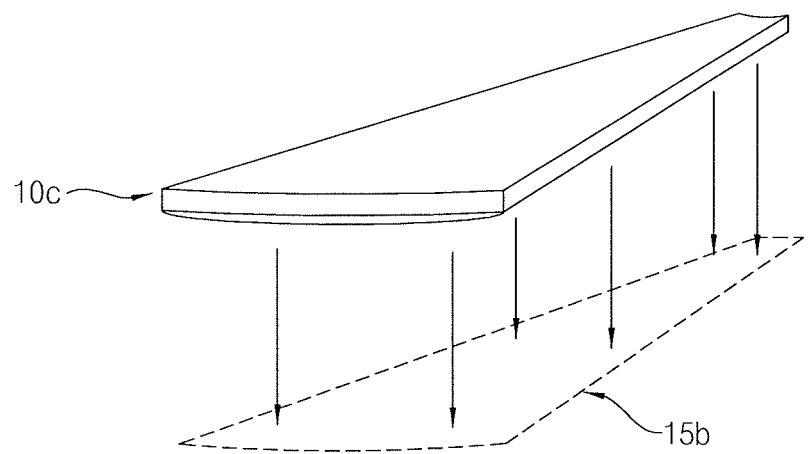

Referring to FIG. 4C, the deposition sections DS and/or the surface treatment sections STS of the ALD apparatuses 100A to 100H may have a sector-shape light source 10c. The illumination area 15b by the sector-shape light source 10c may also have a sector shape. In an embodiment, the light source 10c may be of a trapezoidal type similar to a fan. The trapezoidal type may be considered to have a sector shape. Thus, the sector shape includes the trapezoid shape. When the process sections PS revolves, a linear speed of the outer region far from the revolution axis A is faster and the moving distance is greater than the inner region closer to the revolution axis A. Therefore, the outer region may have a larger horizontal width than the inner region.

Figure 4D:
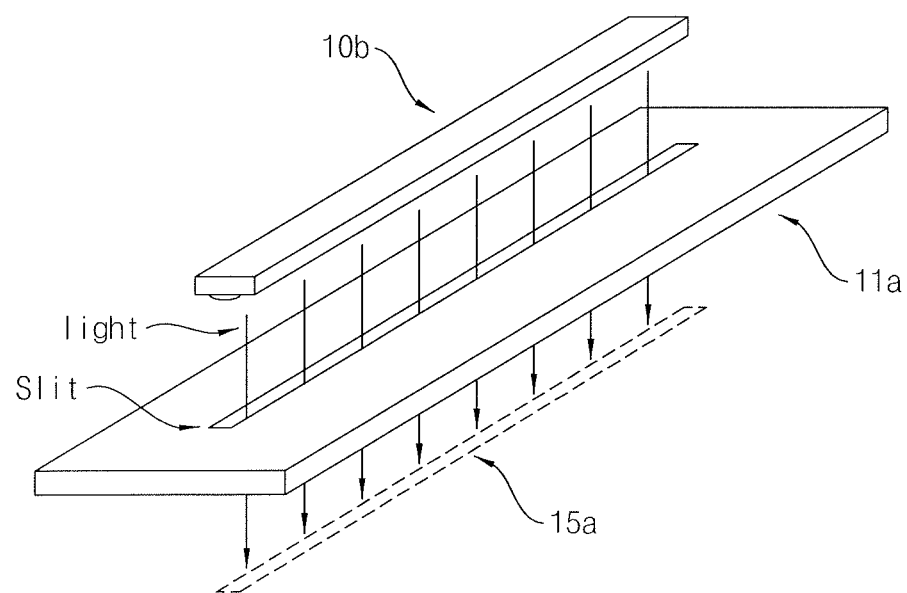

Referring to FIG. 4D, the deposition sections DS and/or surface treatment sections STS of the ALD apparatuses 100A to 10011 have the bar-shape light source 10b and the bar-shape aperture 11a. For example, the bar-shape aperture 11a may have a bar or line type slit. Therefore, the illumination area 15a may also have the bar or line shape.

Figure 4E:
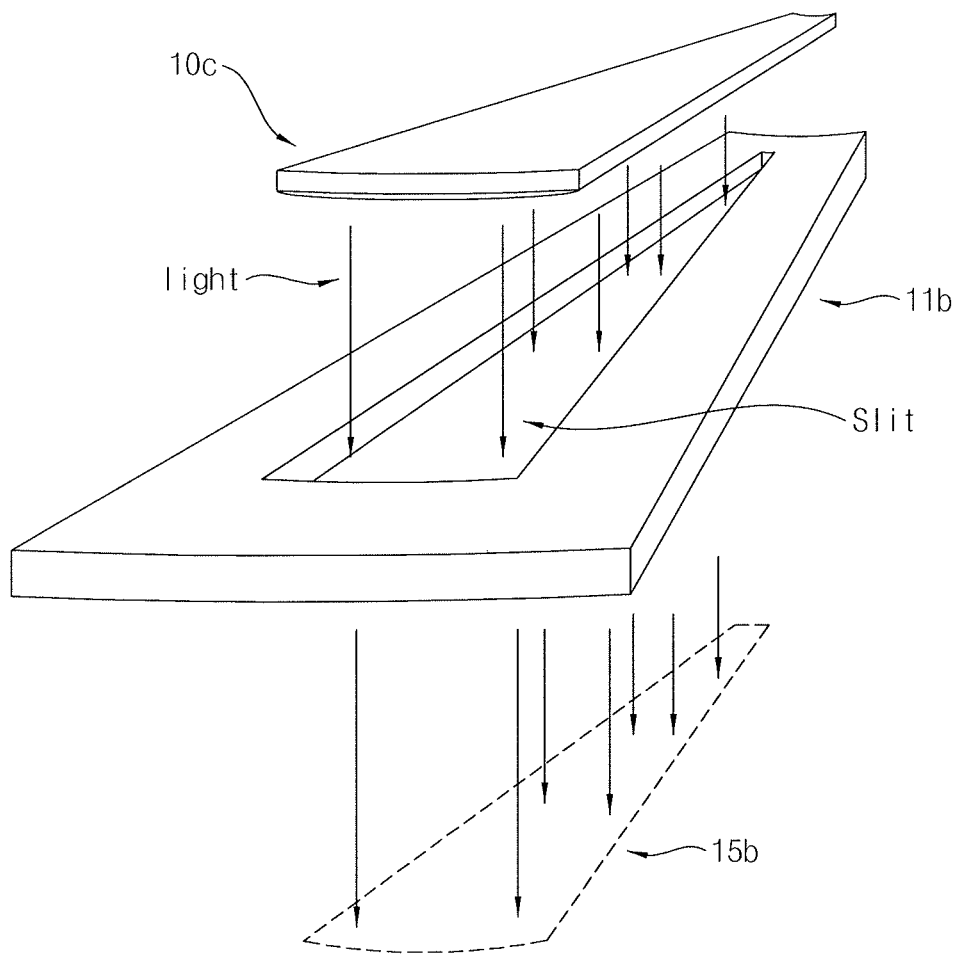

Referring to FIG. 4E, the deposition sections DS and/or surface treatment sections STS of the ALD apparatuses 100A to 100H have the sector type light source 10c and a sector type aperture 11b. For example, the sector type aperture 11b may have a sector type slit. Therefore, the illumination area 15b may also have a sector shape.

Figure 5A:
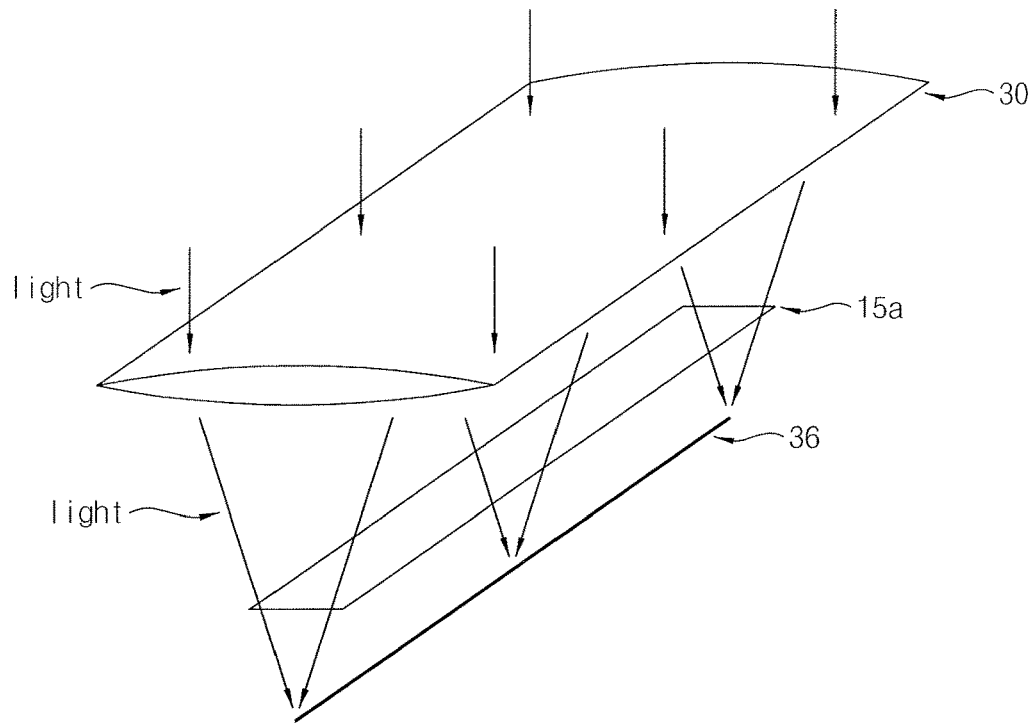
FIGS. 5A and 5B illustrate schematic views of lenses in accordance with various embodiments.
Figure 5B:
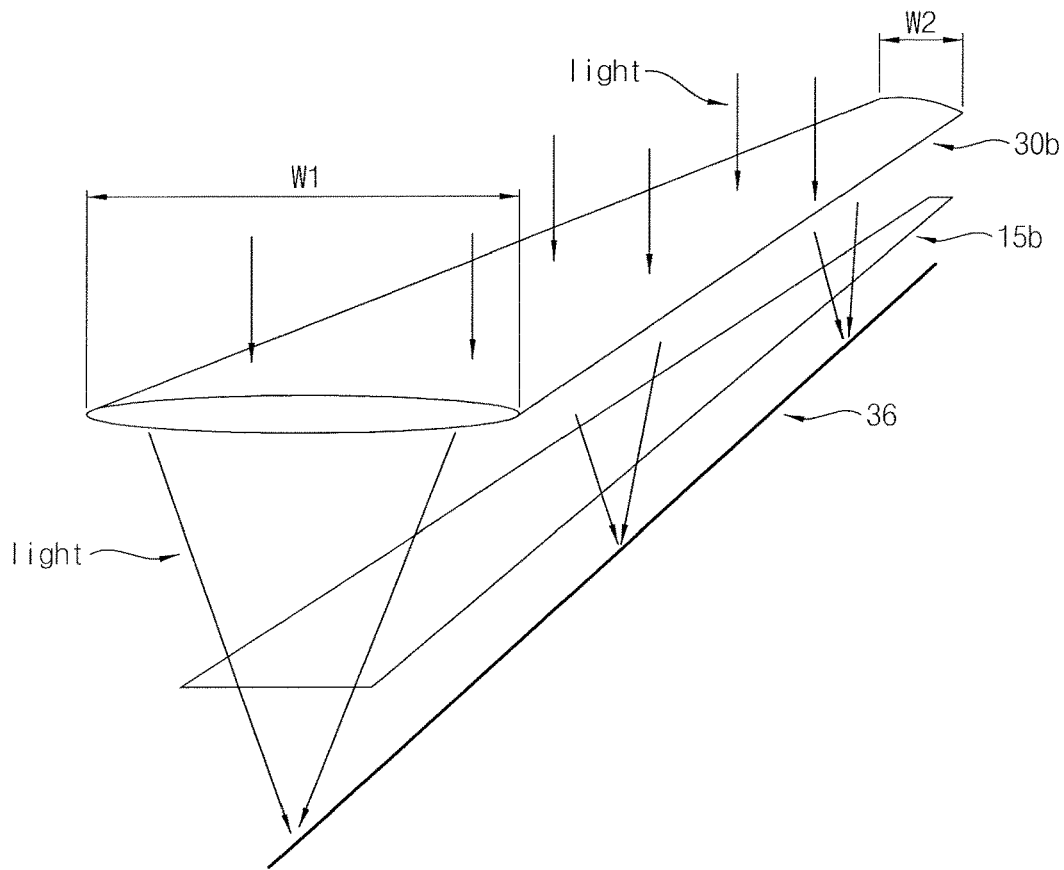

FIGS. 5A and 5B are schematic views of lenses 30a and 30b in accordance with various embodiments.

Referring to FIG. 5A, a bar-shape lens 30a in accordance with an embodiment may include a cylindrical convex lens. For example, the bar-shape lens 30a may have a double arc shape or an elliptical shape in a first sectional view, both of which are convex on the upper and lower surfaces. The bar-shape lens 30a may be semi-cylindrical (or half-cylindrical). The bar-shape lens 30a may have a rectangular shape in a second sectional view and/or a top view. The first sectional view, the second sectional view, and the top view may be perpendicular to each other. The bar-shape lens 30a may have a UV illumination area 15a in the form of a bar and a linear focus line 36. For example, the UV illumination area 15a of the bar-shape lens 30a may have a substantially rectangular shape, and the focus line 36 of the bar-shape lens 30a may be linear. In an embodiment, the lens 30a may have a convex lens having a concave upper surface and a convex lower surface, or having a convex upper surface and concave lower surface in a longitudinal sectional view.

Referring to FIG. 5B, a trapezoidal lens 30b in accordance with an embodiment may include cylindrical convex lenses having different horizontal widths W1 and W2 at both ends. Therefore, the illumination region 15b of the trapezoidal lens 30b may also have a trapezoidal shape. The trapezoidal lens 30b may have a linear focus line 36.

Figure 6A:
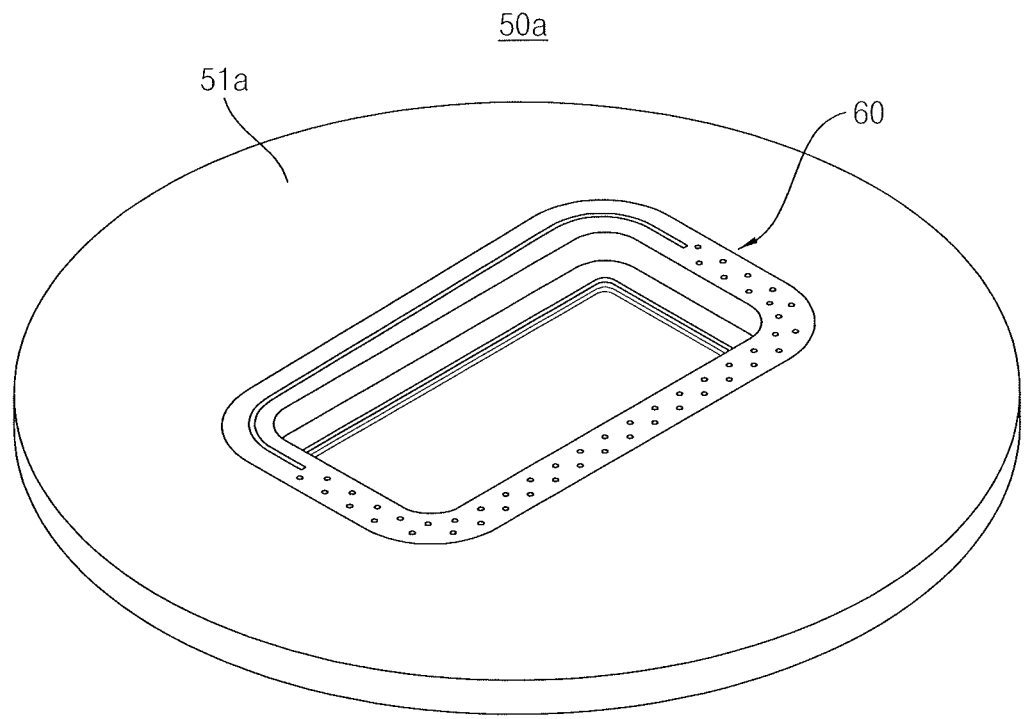
FIGS. 6A and 6B illustrate perspective views of pocket modules in accordance with various embodiments.
Figure 6B:
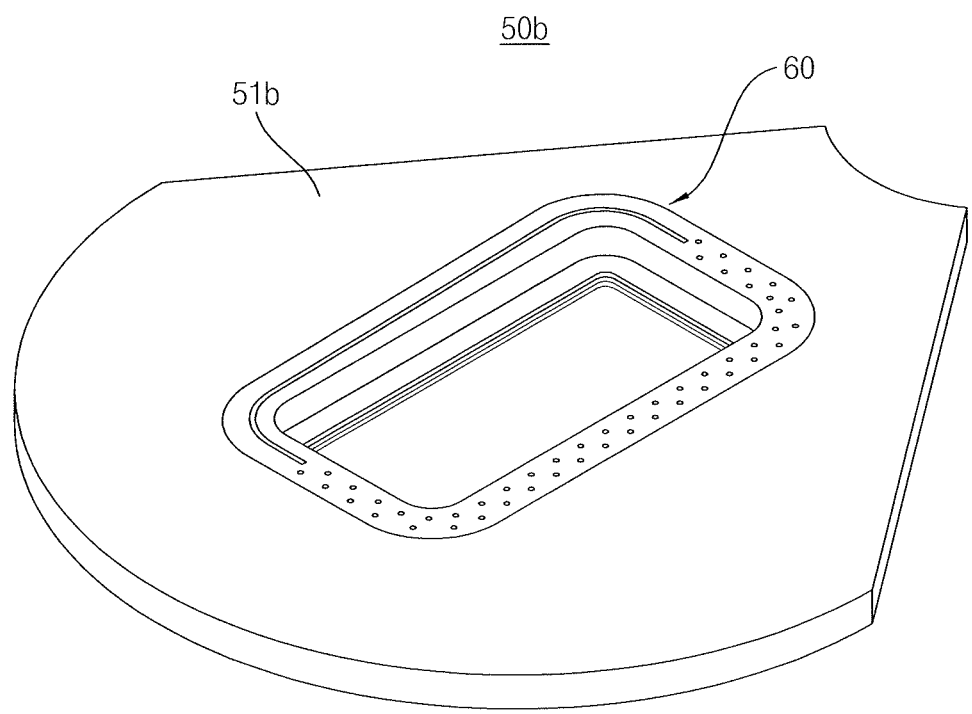

FIGS. 6A and 6B are perspective views illustrating pocket modules 50a and 50b in accordance with various embodiments.

Referring to FIG. 6A, a pocket module 50a in accordance with an embodiment may include an upper panel 51 having a circle shape or a disk shape, and a rectangular lens pocket 60 disposed in the center of the upper panel 51a.

Referring to FIG. 6B, the pocket module 50b in accordance with an embodiment may include a sector-like upper panel 51b and a rectangular lens pocket 60 at the center of the upper panel 51b. The lens pocket 60 may be combined with and separated from the upper panels 51a and 51b, respectively. In an embodiment, the upper panels 51a and 51b and the lens pocket 60 may be integral in one body. The lens pocket 60 may have a whirlpool bath or rectangular trough shape with a recess (for example, a groove or a trench) for the lens 30 to be mounted on or placed in.

Figure 7A:
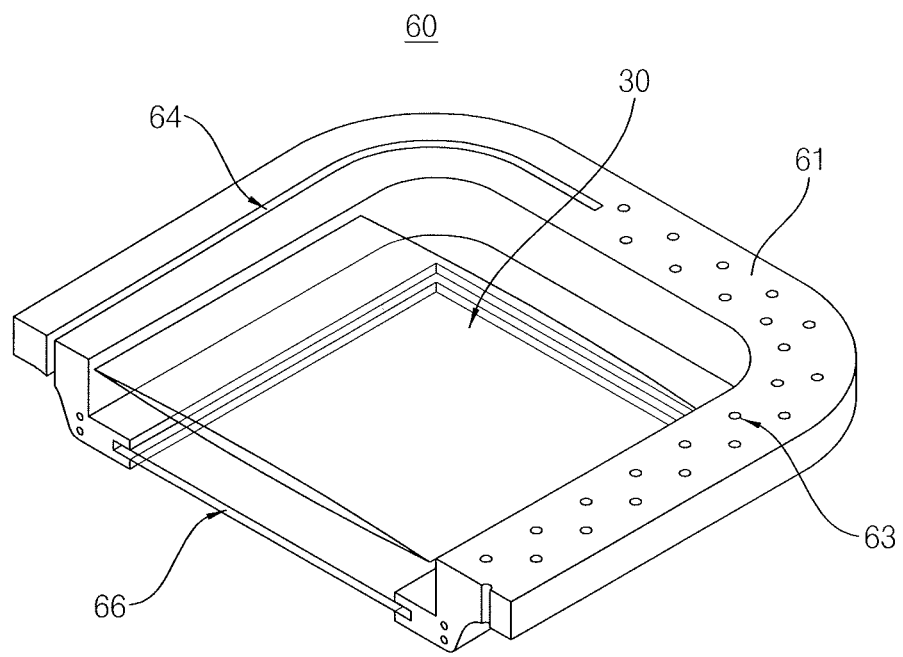
FIG. 7A illustrates a three-dimensional cross-sectional perspective view of a lens pocket.
Figure 7B:
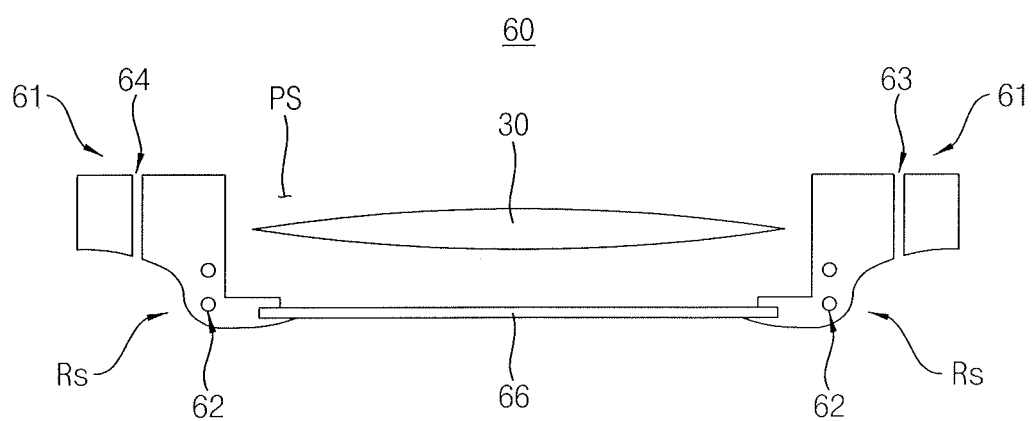
FIG. 7B illustrates a two-dimensional vertical cross-sectional view of the lens pocket.
Figure 7C:
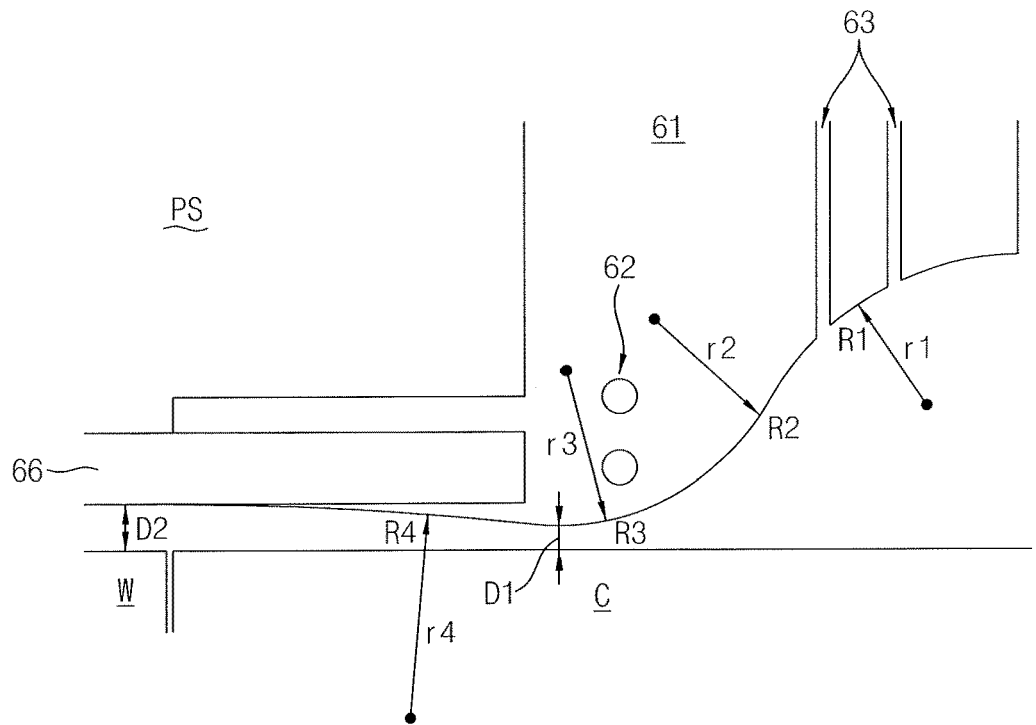
FIG. 7C illustrates a two-dimensional enlarged vertical sectional view of a lower edge of the lens pocket shown in FIG. 6B.

FIG. 7A is a three-dimensional cross-sectional perspective view of the lens pocket 60, FIG. 7B is a two-dimensional vertical cross-sectional view of the lens pocket 60, and FIG. 7C is a two-dimensional enlarged vertical sectional view of a lower edge of the lens pocket 60 of FIG. 6B.

Referring to FIGS. 7A to 7C, the lens pocket 60 may include a frame part 61 and a transparent panel 66. In the top view, the frame part 61 may have a substantially rectangular shape. The frame part 61 may surround side surfaces of the lens 30. In an embodiment, the frame part 61 may be located at the same horizontal level as the lens 30. The upper surface of the frame part 61 may be co-planar with the upper surface of the upper panel 51. The transparent panel 66 may be spaced apart from the lower surface of the lens 30. The upper surface of the transparent panel 66 may be located at a lower level than the upper surfaces of the upper panel 51 and the frame part 61. For example, the transparent panel 66 may be mechanically and physically connected to the lower portion of the frame part 61. The frame part 61 may include cooling holes 62, an air inlet 63, and an air inlet 63, and an air outlet 64. Refrigerant may flow through the cooling holes 62, and air may flow in and out through the air inlet 63 and air outlet 64, respectively.

The cooling holes 62 may be formed along the rectangular frame to penetrate the inside of the frame part 61. The cooling holes 62 may provide an air passage through which coolant such as water is circulated. The coolant in the cooling holes 62 may prevent the lens pocket 60 from being overheated by the UV laser. In an embodiment, the cooling holes 62 may be positioned close to the transparent panel 66, thereby more effectively protecting the transparent panel 66 from overheating. The cooling holes 62 may include two or more holes to maximize the cooling efficiency. For example, at least one of the cooling holes 62 may be disposed at a substantially same or similar horizontal level as the transparent panel 66 to surround the transparent panel 66.

The air inlet 63 may include a plurality of holes vertically penetrating a first half of the frame part 61, for example, the right half. The air inlet 63 may be supply inert gases such as argon (Ar) or helium (He), air or nitrogen ($N_2$), etc., onto the lower surface of the frame part 61 and the lower surface of the transparent panel 66. The air outlet 64 may include a slit formed along the frame part 61 to vertically penetrate the second half of the frame part 61, for example, the left half. The air outlet 64 may include at least one slit to allow the air supplied through the air inlet 63 to be discharged efficiently. The air outlet 64 may provide a wider space and a cross-sectional area through which the air passes faster than the air inlet 63. The air supplied through the air inlet 63 may flow onto the lower surface of the transparent panel 66, and the air may then be discharged through the air outlet 64. The air supplied and exhausted by the air inlet 63 and the air outlet 64 may provide an air curtain for the lens pocket 60. Accordingly, foreign substances such as particles may be prevented from being adsorbed on the surface of the lens pocket 60, particularly, the lower surface of the transparent panel 66. In addition, the air may cool the transparent panel 66 together with the refrigerant passing through the cooling holes 62.

The transparent panel 66 may include a transparent material. The transparent panel 66 may include a material having a high transmittance to light and a high thermal conductivity to reduce heat burden while transmitting light. Higher transmittance may lessen energy absorption and high thermal conductivity may quicken heat dissipation. For example, the transparent panel 66 may include sapphire ($Al_2O_3$). In an embodiment, the sapphire may have a transmittance of 80% or more and a thermal conductivity of at least about 34.6 W/mk.

The lens 30 may be located within the lens pocket 60. The lens 30 may be positioned within the pocket space PS defined by the frame part 61 and the transparent panel 66. The pocket space PS may be a concave space in the form of a bowl or a dish in which the side is defined by the frame part 61 and the lower surface is defined by the transparent panel 66. For example, the pocket space PS may be a space in the form of a rectangular trough or whirlpool bath that is recessed downward from the upper surface of the upper panel 51. Referring to FIG. 2, the lens 30 disposed in the lens pocket 60 may be close to the wafer W on the wafer supporting part 70.

The pocket space PS allows the lens 30 to be positioned at or below the upper surface of the upper panel 51. The upper panel 51 may be located at the same level as the horizontal panels in the other surrounding sections (cleaning section CS, deposition section DSx, and/or heat treatment section HTS) of the surrounding areas to maintain spatial uniformity to control the degree of vacuum and gases provided within the sections (CS, DS, and/or HTS). Therefore, the pocket space PS in accordance with an embodiment may provide an optical system having a shortened focal length (for example, 50 mm or less) and an enlarged numerical aperture (NA) of lens 30 by shortening the optical and physical distance between the lens 30 and the wafer W. When the numerical aperture (NA) of the lens 30 is increased, the lens 30 collects more light and may irradiate the wafer W with improved light energy efficiency. Thus, process time may be shortened and the throughput may be increased, thus increasing productivity and lowering production cost. The pocket module 50 in accordance with various embodiments may be an optical system-oriented vacuum pocket module that is capable of adjusting the optical system of the optical surface treatment section STS of the ALD apparatus 100.

Referring to FIG. 7C, the lower edge of the frame part 61 may be rounded to have curved surfaces R1, R2, R3, and R4. The curved surfaces R1, R2, R3, and R4 may have various curvature radiuses. For example, the lower edge of the frame part 61 may include a first curved surface R1 having a first curvature radius r1, a second curved surface R2 having a second curvature radius r2, a third curved surface R3 having a third curvature radius r3, and a fourth curved surface R4 having a fourth curvature radius r4. For example, the first curved surface R1 may be adjacent to the air inlet 63, and the fourth curved surface R4 may be formed to support the transparent panel 66 on the lower surface of the frame part 61. The second curved surface R2 and the third curved surface R3 may be between the first curved surface R1 and the fourth curved surface R4. The air inlet 63 may be disposed on the first curved surface R1.

The curved surfaces R1, R2, R3, and R4 may have convex surfaces R2 and R3, and concave surfaces R1 and R4. The curved surfaces R1, R2, R3, and R4 may be smoothly connected to each other. The curved surfaces (R1 to R4) may control the flow of air. For example, the lower portion of the frame part 61 having smooth curved surfaces R1 to R4 may prevent an air flow barrier or an airflow shadow, which is a fluid resistance element, and may prevent a vortex caused by the flow resistance element from occurring while increasing the speed of the air by lengthening the travel path of the air. As the flow rate of the air is increased, the pressure is lowered, so that foreign substances in the surroundings do not adsorb to the frame part 61 and the transparent panel 66 but are sucked into the airflow so that the air curtain effect may be further maximized.

In order to more efficiently control the flow of air, the curvature radiuses r1, r2, r3, and r4 may have values relative to each other. For example, the first curvature radius r1 of the first curved surface R1 may have a negative value ("negative" may mean a concave curved surface). The second curvature radius r2 of the second curved surface R2 may be a positive value having an absolute value similar to the first curvature radius r1 ("positive" may mean a convex curved surface). The third curvature radius r3 of the third curved surface R3 may be equal to or less than the second curvature radius r2. The fourth curvature radius r4 of the fourth curved surface R4 may be a negative value having an absolute value greater than the first to third curvature radiuses r1 to r3. In an embodiment, the third curvature radius r3 of the third curved surface R3 is smaller than the second curvature radius r2 of the second curved surface R2.

The lower portion of the frame part 61 that supports the transparent panel 66 may have a convex curved surface downward to prevent a vortex caused by airflow shadows. For example, the lower portion of the frame part 61 may have an inwardly directed flange shape. The end portion of the inwardly directed flange supporting the transparent panel 66 may have a streamlined curved surface so that airflow shadows do not occur.

In an embodiment, a distance D1 between the lowermost portion of the lower edge of the frame part 61 and the chuck C of the wafer stage 76 may be less than a distance D2 between the transparent panel 66 and the wafer W on the wafer stage 76. Accordingly, air that passes through the narrow space between the lower edge of the frame part 61 and the chuck C may flow faster as it moves to a relatively large space formed by the transparent panel 66 and the surface of the wafer W.

In an embodiment, the lower edge of the frame part 61 may have at least two negative curved surfaces R1 and R4, and at least one positive curved surface R2 or R3.

The lower edge of the frame part 61 in which the air outlet 64 is disposed may have a symmetrical structure with the lower edge of the frame part 61 in which the air inlet 63 is disposed. Therefore, a description of the lower edge of the frame part 61 in which the air outlet 64 is disposed is omitted.

Figure 8A:
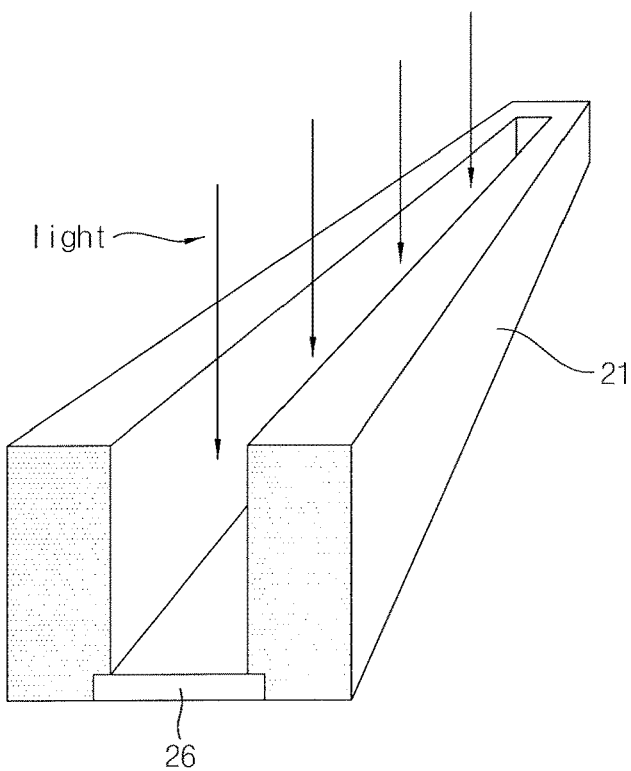
FIGS. 8A to 8C illustrate schematic three-dimensional cross-sectional views of beam shapers in accordance with various embodiments.
Figure 8B:
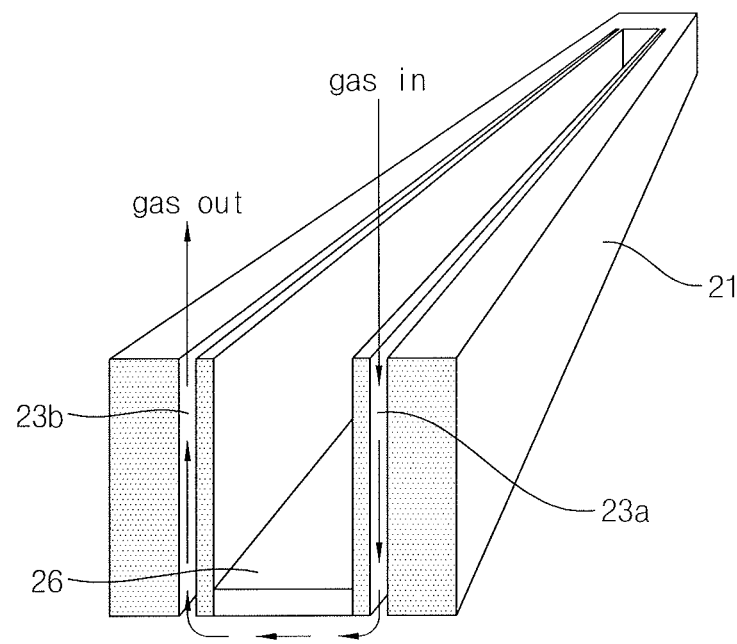
Figure 8C:
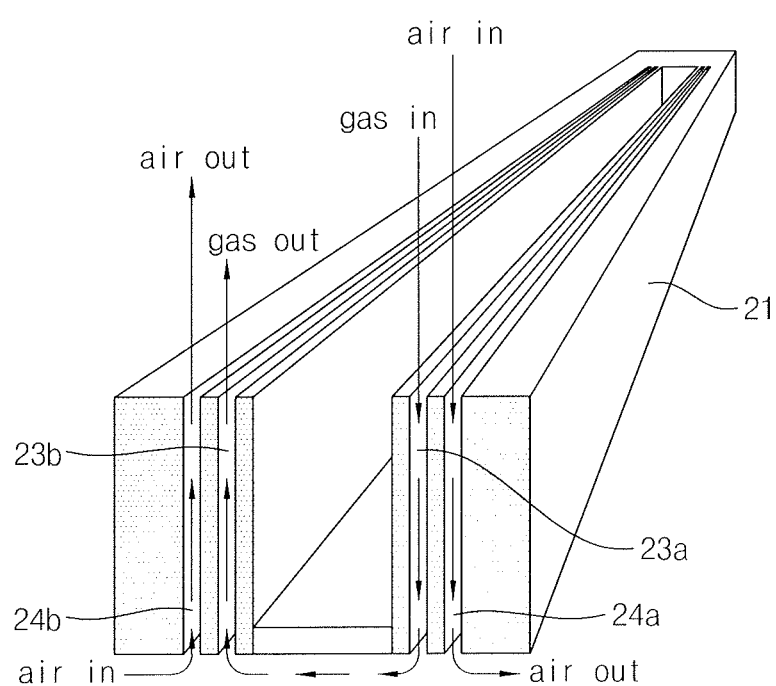
Figure 8D:
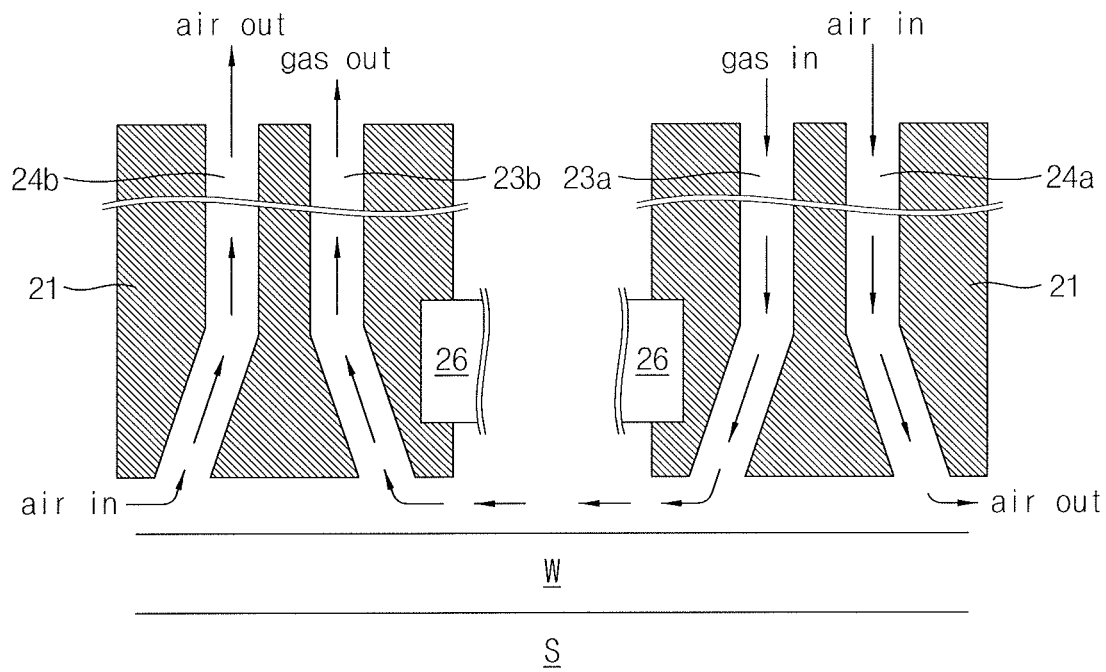
FIG. 8D illustrates an enlarged view of a portion of the beam shaper shown in FIG. 8C.

FIGS. 8A to 8C are three-dimensional cross-sectional views schematically illustrating the beam shapers 20a to 20c in accordance with various embodiments, and FIG. 8D is an enlarged view of a portion of beam shaper 20c shown in FIG. 8C.

Referring to FIG. 8A, the beam shaper 20a may have beam guides 21, and a transparent panel 26 between the beam guides 21. The beam guides 21 may define a central trench or slit such that the beam shaper 20a has a trough shape. The transparent panel 26 may be disposed on the bottom surface of the trench (or slit) between the beam guides 21. Light may be provided on the wafer through the trenches (or slits) defined by the beam guides 21 and the transparent panel 26. The beam guide 21 may include an opaque material such as stainless steel metal, and the transparent panel 26 may include a transparent material such as quartz or sapphire. The beam shaper 20a may be more specifically understood with reference to FIGS. 1E to 1H, and 3A.

Referring to FIG. 8B, the beam shaper 20b may include beam guides 21, gas pipes 23a and 23b, and a transparent panel 26. The gas pipes 23a and 23b may include a gas inlet pipe 23a and a gas outlet pipe 23b. Further referring to FIG. 3B, the gas inlet pipe 23a may vertically penetrate the interior of one of the beam guides 21 to provide an air passage for supplying reaction gases to the lower side of the beam shaper 20b, for example, on the surface of the wafer W. The gas outlet pipe 23b may vertically penetrate the interior of the other one of the beam guides 21 to provide an air passage for discharging a reaction gas from below the beam shaper 20b, for example, from the surface of the wafer W. As illustrated in FIG. 8B, the gas pipes 23a and 23b may have a slit shape, for example, as continuous slits extending along respective sides of the beam shaper 20b. In another embodiment, any of the gas pipes 23a or 23b may have a hole shape, as for example, air inlet 63 described above. For example, the gas inlet pipe 23a may have a hole shape and the gas outlet pipe 23b may have a slit shape. In an embodiment, both of the gas pipes 23a and 23b may have a hole shape. The beam shaper 20b may be more specifically understood with reference to FIGS. 1E to 1H, and 3B.

Referring to FIG. 8C, the beam shaper 20c may include beam guides 21, gas pipes 23a and 23b, air pipes 24a and 24b, and a transparent panel 26. The air pipes 24a and 24b may be an air inlet pipe 24a and an air outlet pipe 24b. The air inlet pipe 24a may provide a passage for supplying the reaction gas to the lower side of the beam shaper 20c, for example, on the surface of the wafer W. The air outlet pipe 24b may provide a passage for discharging the reaction gas from below the beam shaper 20c, for example, from the surface of the wafer W. For example, the air pipes 24a, 24b may have a slit shape. In an embodiment, any one of the air pipes 24a, 24b may have the shape of a hole. For example, the air inlet pipe 24a may have a hole shape, and the air outlet pipe 24b may have a slit shape. In an embodiment, the air pipes 24a and 24b may both have a hole shape.

Referring again to FIGS. 8A to 8C, the beam shapers 20a to 20c may have a sector (or trapezoid) shape in the top view. For example, the horizontal width may become wider from the first end to the second end. Thus, the trenches (or slits) defined by the beam guides 21 may also have a sectoral (or trapezoidal) shape in the top view, and the transparent panel 26 between the beam guides 21 may also have a sector (or trapezoidal) shape.

In an embodiment, the beam shapers 20a to 20c may have a bar-shape in the top view. For example, the horizontal width of the first end and the horizontal width of the second end may be substantially the same. Thus, the trench (or slit) defined by the beam guides 21 may also have a bar-shape in the top view, and the transparent panel 26 between the beam guides 21 may also have a bar-shape in the top view.

Referring to FIG. 8D, the gas inlet pipe 23a and the gas outlet pipe 23b may have lower portions inclined toward a center of the transparent panel, for example, toward the wafer stage S. The reaction gas supplied onto the wafer W through the gas inlet pipe 23a may contribute to form a material layer on the surface of the wafer W located under the transparent panel 26. Excess gas and by-products passing through the lower portion of the gas outlet pipe 26 may be discharged to the outside through the gas outlet pipe 23b. The air inlet pipe 24a and the air outlet pipe 24b may include lower portions inclined to the opposite direction with respect to the center where the transparent panel 26 is disposed, for example, toward the outer periphery of the wafer W on the wafer stage S. The air supplied onto the wafer W through the air inlet pipe 24a may flow in a direction opposite to the reaction gas supplied onto the wafer W through the gas inlet pipe 23a. For example, the air supplied through the air inlet pipe 24a may flow-out to the outside of the wafer W and be discharged to the outside. The air outlet pipe 24b may suck the inflow air from a direction opposite to the lower part of the transparent panel 26 and may discharge to the outside through the beam guide 21. The air supplied through the air inlet pipe 24a may flow out around the wafer W and the air from the periphery of the wafer W may be discharged to the outside through the air outlet pipe 24b. Thus, the air that flows in through the air inlet pipe 24a and flows out through the air outlet pipe 24b may form an air curtain so that the reaction gas does not leak to the outside. The beam shaper 20c may be more specifically understood with reference to FIGS. 1E to 1H, and 3C.

The air flowing through the air pipes 24a and 24b may help cool the beam shaper 20c.

Figure 9A:
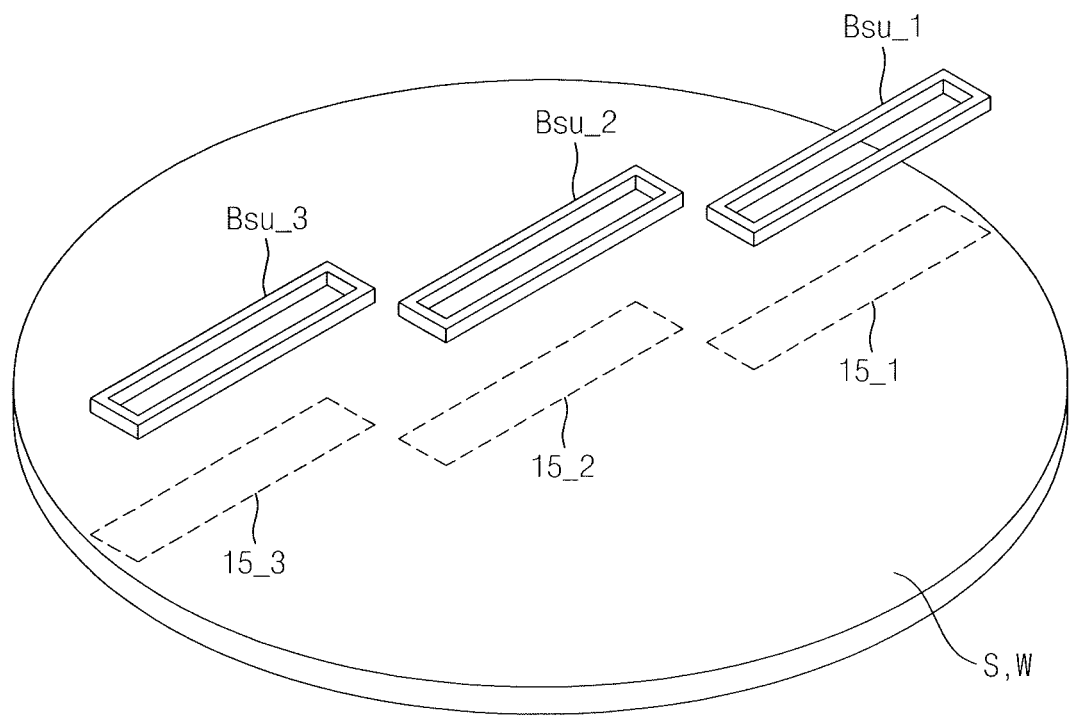
FIGS. 9A and 9B illustrate views of a configuration of a unit beam shaper of an atomic layer deposition apparatus in accordance with an embodiment.
Figure 9B:
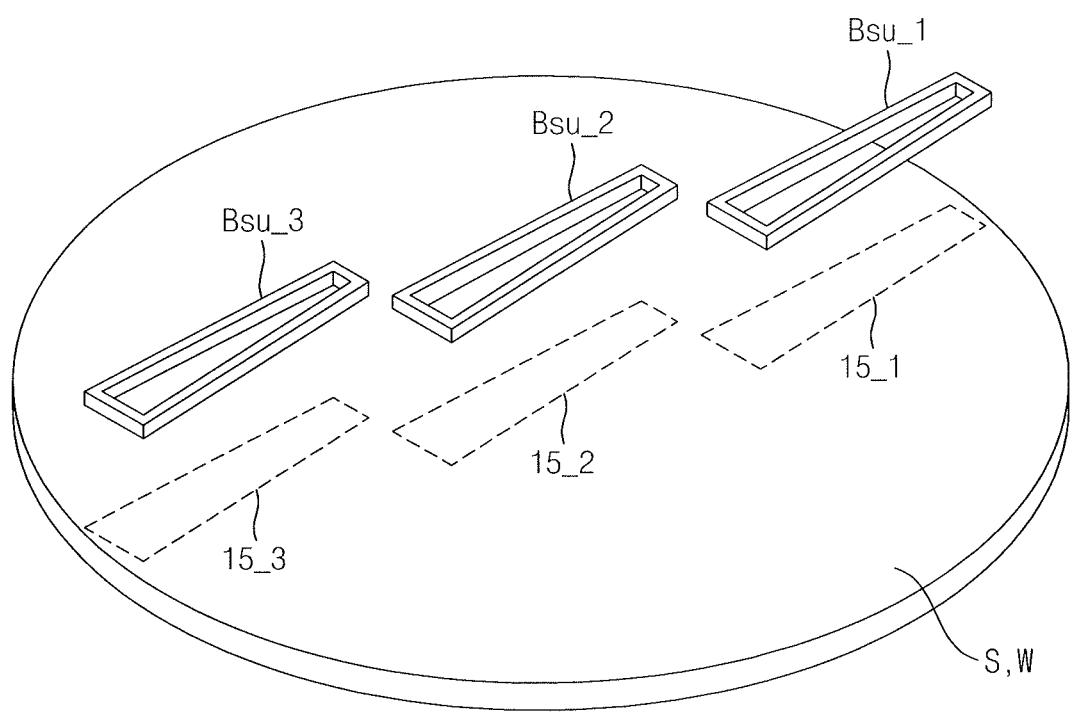

FIGS. 9A and 9B are views illustrating a configuration of the unit beam shaper BSu of the ALD apparatus 100F in accordance with an embodiment.

Referring to FIG. 9A, the ALD apparatus 100F in accordance with an embodiment may include a plurality of unit beam shapers BSu_1, BSu_2, and BSu_3 disposed in one process section PS, respectively. For example, the plurality of unit beam shapers BSu_1, BSu_2, BSu_3 may have a rectangular trough or whirlpool bath shape. The plurality of unit beam shapers BSu_1, BSu_2, and BSu_3 may include an inner unit beam shaper BSu_1, a middle unit beam shaper BSu_2, and an outer unit beam shaper BSu_3. Referring FIGS. 1E, and 8A to 8D, the plurality of unit beam shapers BSu_1, BSu_2, and BSu_3 may be configured to exhibit the same effect as the beam shaper BS. For example, the plurality of unit beam shapers BSu_1, BSu_2, and BSu_3 may have a plurality of unit illumination areas 15_1, 15_2, and 15_3 that scan the surface of the wafer W on the wafer stage S by a horizontal moving of the wafer stage S. The total length of the unit illumination areas 15_1, 15_2, and 15_3 may be equal to or greater than the diameter of the wafer stage S or the wafer W. The plurality of unit beam shapers BSu_1, BSu_2, and BSu_3 may be configured to be moved and fixed independently from each other. For example, referring to FIG. 1F, the plurality of unit beam shapers BSu_1, BSu_2, and BSu_3 may be configured in various shapes. The plurality of unit illumination regions 15_1, 15_2, and 15_3 may be formed independently of each other. Due to the diffraction phenomenon of light, the plurality of unit illumination regions 15_1, 15_2, and 15_3 may partially overlap each other. Referring to FIG. 4D, the plurality of unit beam shapers BSu_1, BSu_2, and BSu_3 may include a bar or linear light source 10b and a bar or linear aperture 11a, respectively. For example, the plurality of unit beam shapers BSu_1, BSu_2, and BSu_3, and the plurality of unit illumination areas 15_1, 15_2, and 15_3 may have the same or similar shape.

Referring to FIG. 9B, in an embodiment, the plurality of unit beam shapers BSu_1, BSu_2, and BSu_3 may include the sector type light source 10c and the sector type aperture 11b. The plurality of unit beam shapers BSu_1, BSu_2, and BSu_3 and the plurality of unit illumination regions 15_1, 15_2, and 15_3 may have different sizes. For example, the middle unit beam shaper BSu_2 may be larger than the inner unit beam shaper BSu_1, and the outer unit beam shaper BSu_3 may be larger than the middle unit beam shaper BSu_2. The middle unit illumination area 15_2 may be wider than the inner unit illumination area 15_1, and the outer unit illumination area 15_3 may be wider than the middle unit beam shaper 15_2.

FIGS. 10A to 10F are diagrams illustrating the light energy distribution in the illumination areas 15a and 15b and the unit illumination areas 15_1, 15_2, and 15_3 in accordance with various embodiments. The X-axis may be a length axis and the Y-axis may be an energy axis.

Figure 10A:
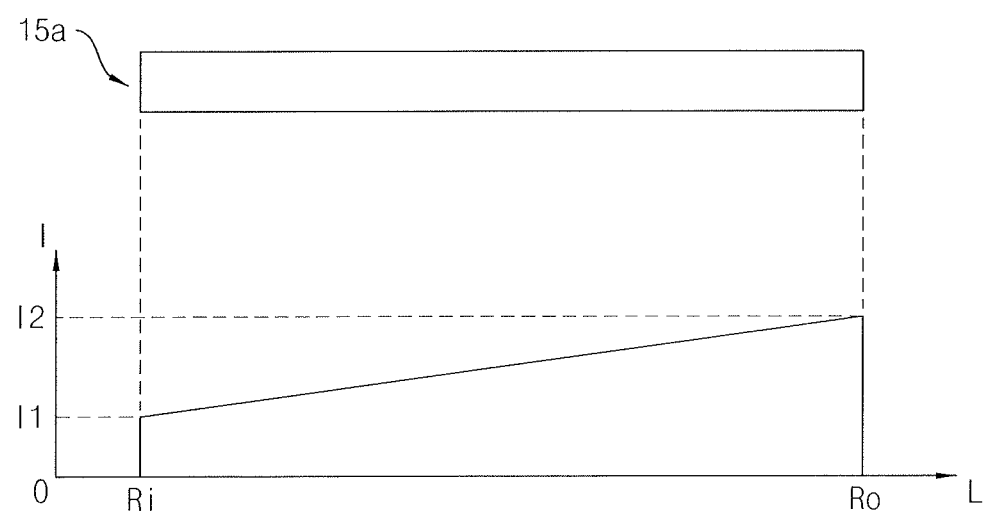
FIGS. 10A to 10F illustrate diagrams of the light energy distribution in illumination areas and the plurality of unit illumination areas in accordance with various embodiments.

Referring to FIG. 10A, in an embodiment, the bar-shaped illumination region 15a may have an energy gradient. For example, the inner region Ri may have a relatively low energy, and the outer region Ro may have a relatively high energy. The inner region Ri may be relatively close to the center of the revolution axis A of FIGS. 1D to 1G, or the wafer stage S of FIG. 1H, and the outer region Ro may be relatively far from the revolution axis A. Therefore, the outer region Ro may have a higher energy than the inner region Ri because the moving distance of the wafer W due to the revolution becomes larger and the moving speed becomes higher as the distance from the center of the revolution axis A or the wafer stage S. In an embodiment, the bar-shape light source 10b may have an inner portion having point light sources arranged with a relatively low density and an outer portion having point light sources arranged with a relatively high density. In an embodiment, the bar-shape light source 10b or bar-shape aperture 11a may include an inner optical filter having a relatively low transmittance and an outer optical filter having a relatively high transmittance.

Figure 10B:
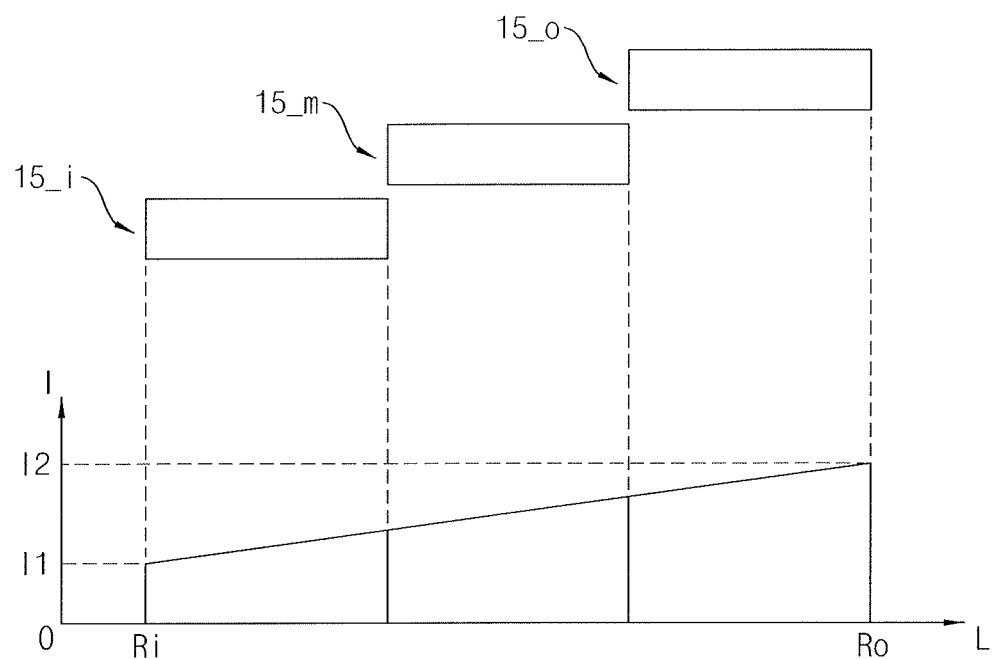

Referring to FIG. 10B, in an embodiment, a plurality of bar-shaped unit illumination areas 15_i, 15_m, and 15_o may have an energy gradient that decreases in the inner region Ri and increases in the outer region Ro. For example, the light energy gradient may increase continuously.

Figure 10C:
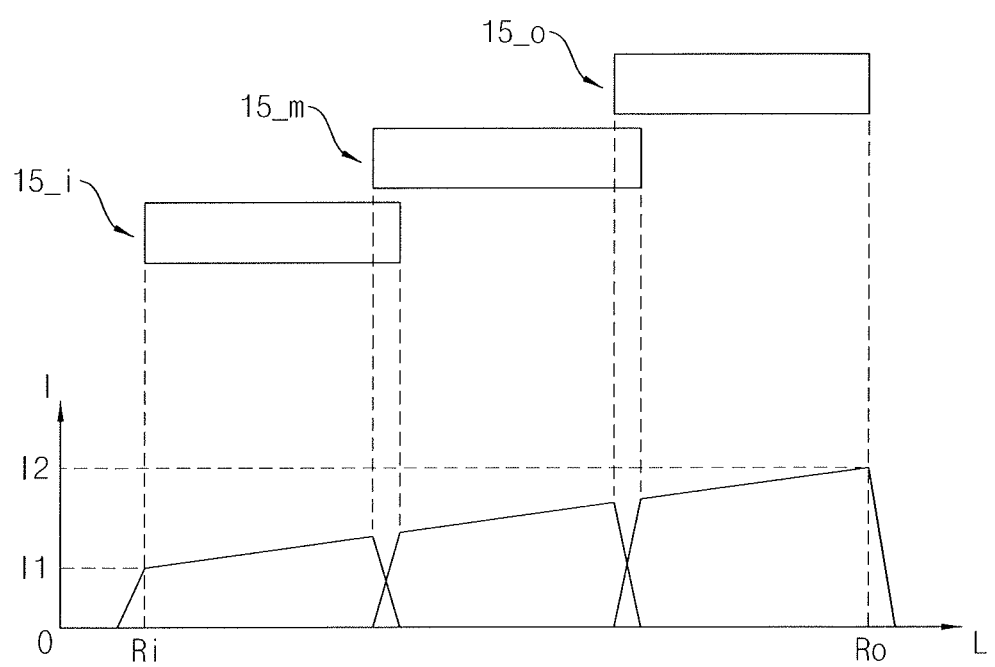

Referring to FIG. 10C, in an embodiment, the plurality of bar-shaped unit illumination areas 15_i, 15_m, and 15_o may partially overlap each other. For example, the light source 10b or the apertures 11a may be spaced apart from each other, but a plurality of bar-shaped unit illumination areas 15_i, 15_m, and 15_o may partially overlap each other because of diffraction. Therefore, the light energy transmitted on the surface of the wafer W may have an approximately continuous energy gradient I1 to I2 in the boundary region of the plurality of bar-shaped unit illumination regions 15_i, 15_m, and 15_o.

Figure 10D:
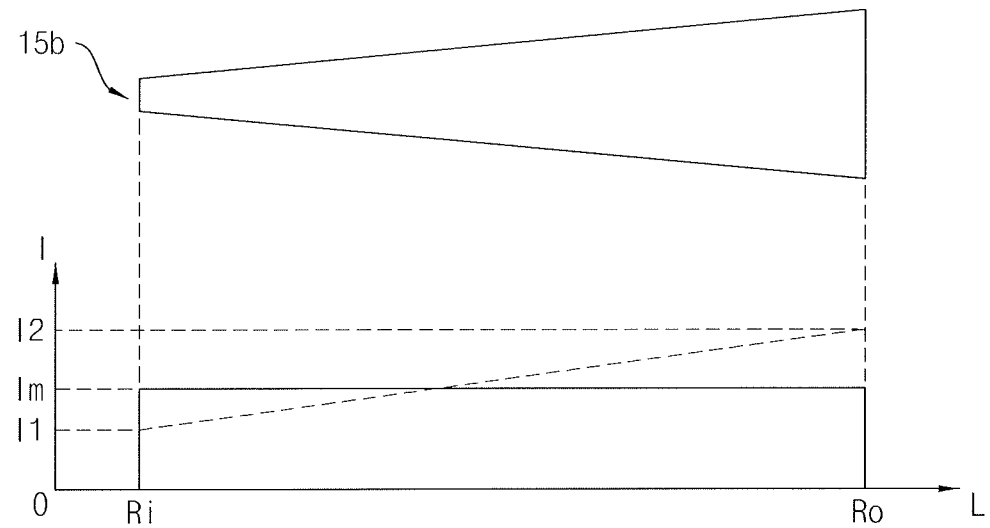

Referring to FIG. 10D, in an embodiment, the sector (or trapezoid) shaped illumination region 15b may have an overall uniform energy gradient 1m. Therefore, since the inner region Ri of the illumination region 15b is relatively narrow and the outer region Ro is relatively wide, the energy I2 transferred by the outer region Ro onto the surface of the wafer W may be higher than the energy I1 transferred by the inner region Ri onto the surface of the wafer W.

Figure 10E:
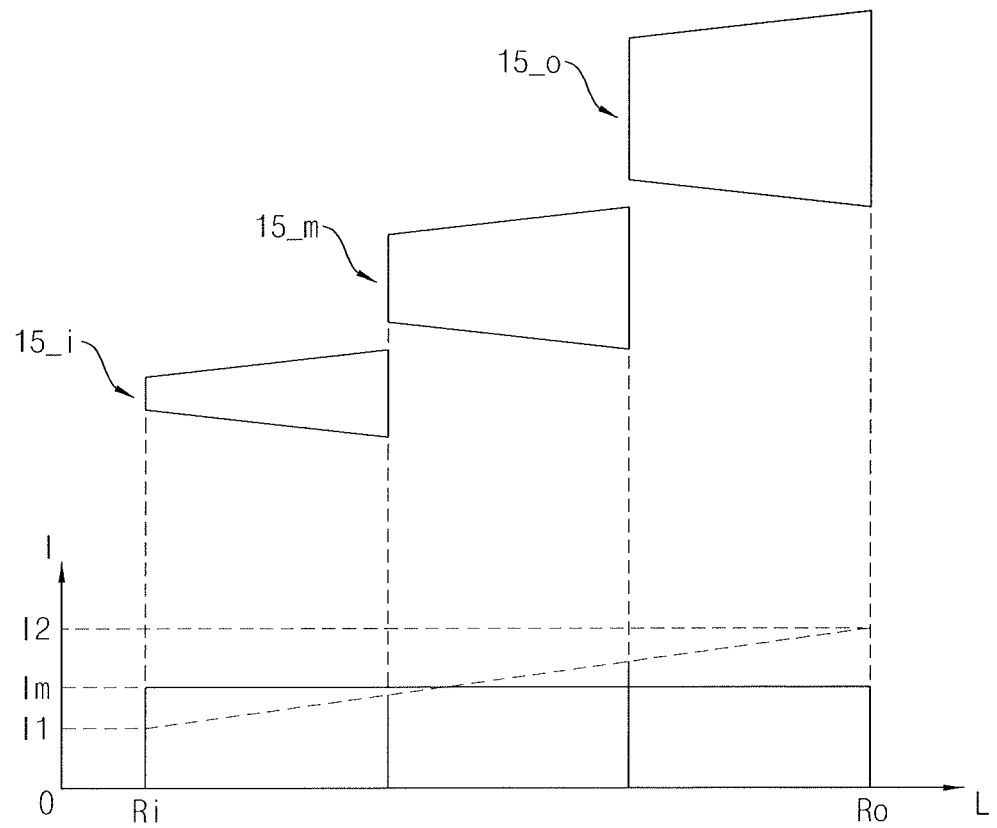

Referring to FIG. 10E, in an embodiment, the plurality of sector (or trapezoid) shaped unit illumination areas 15_i, 15_m, and 15_9 may have a uniform energy gradient Im as a whole. This may be understood with reference to FIG. 10D.

Figure 10F:
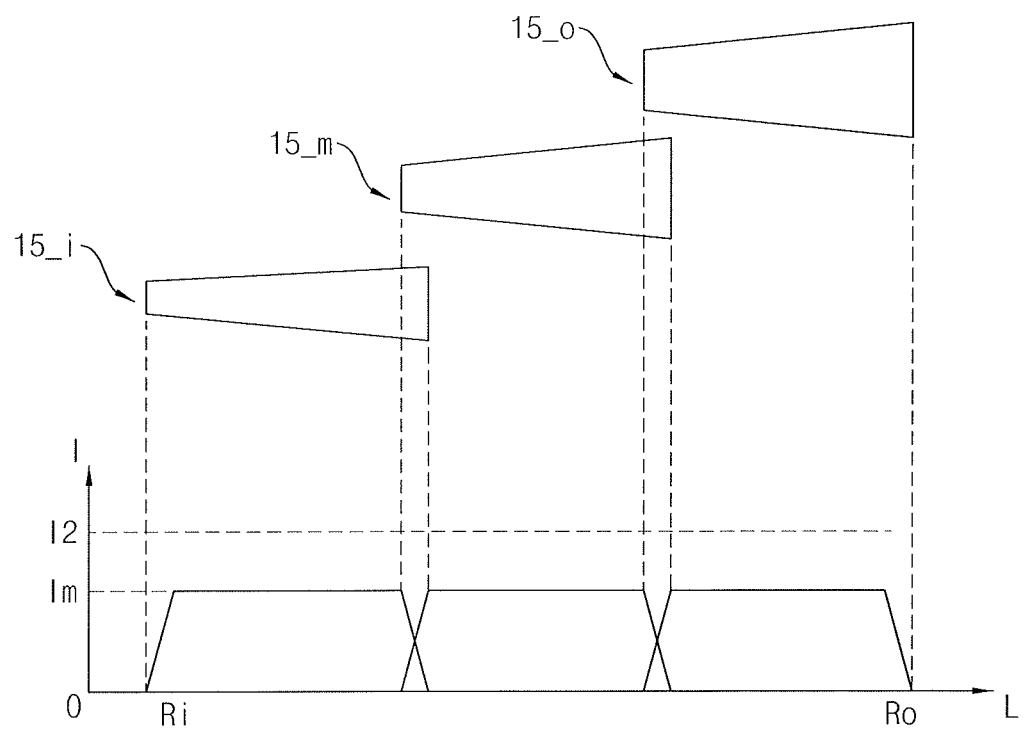

Referring to FIG. 10F, in an embodiment, the plurality of sector (or trapezoid) shaped unit illumination areas 15_i, 15_m, and 15_o may partially overlap each other. For example, the light source 10c or the apertures 11b may be spaced apart from each other, but a plurality of bar-shaped unit illumination areas 15_i, 15_m, and 15_o may partially overlap each other. Accordingly, the light energy transmitted on the surface of the wafer W may have an approximately continuous energy gradient I1 to I2 in the boundary regions of the plurality of bar-shaped unit illumination regions 15_i, 15_m, and 15_o.

Further referring to FIGS. 10D to 10F, the sector (trapezoid) shaped illumination area 15b may be shaped by the sector (trapezoid) shaped light source 10c and/or the aperture 11b having the sector (trapezoid) shaped slit.

Figure 11A:
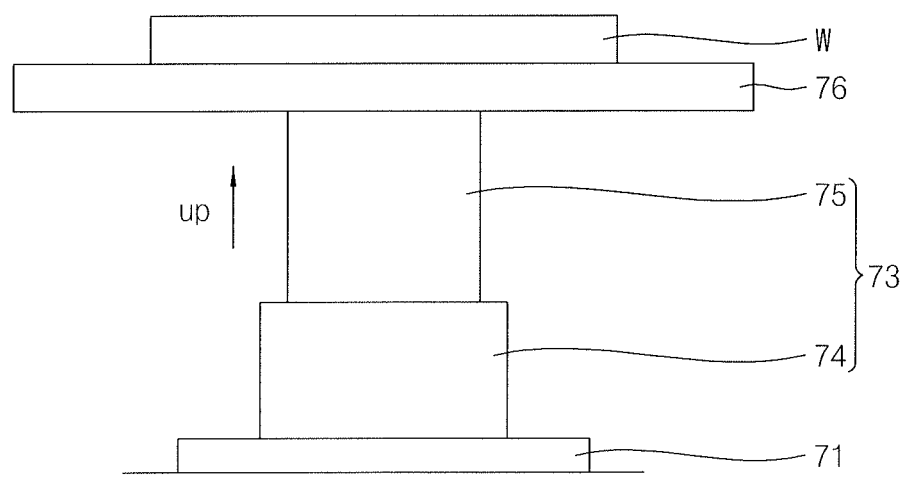
FIGS. 11A and 11B illustrate side views of a wafer supporting part in accordance with an embodiment.
Figure 11B:
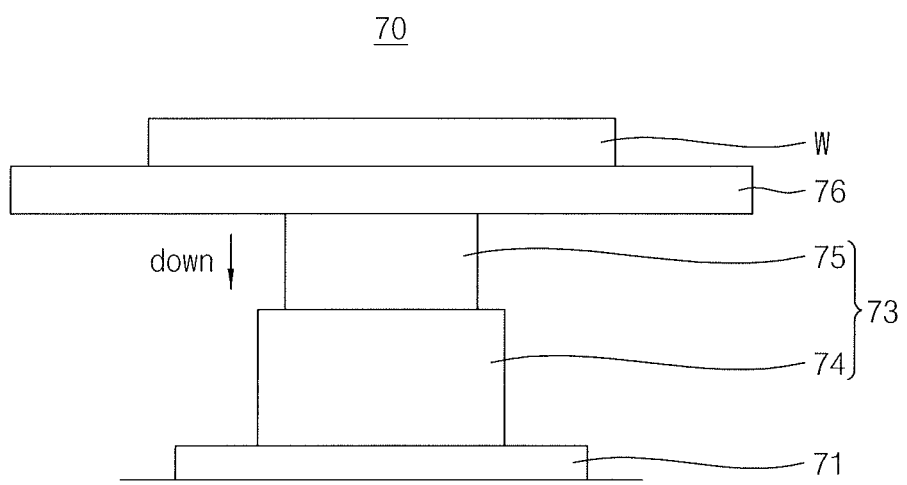

FIGS. 11A and 11B illustrate side views of the wafer supporting part 70 in accordance with an embodiment.

Referring to FIGS. 11A and 11B, the wafer supporting part 70 may include a supporting foot 71, an up-down lift 73, and a wafer stage 76. The wafer W is shown on the wafer stage 76.

The wafer supporting part 70 may be located in a lower portion of the surface treatment section STS shown in FIGS. 1A to 1G. The support foot 71 may support the up-down lift 73 and the wafer stage 76. The up-down lift 73 may move the wafer stage 76 up and down. The up-down lift 73 may include a lower cylinder part 74 and an upper piston part 75. The up-down lift 73 may move the wafer stage 76 up/down by moving the upper piston part 75 inside the lower cylinder part 74. Referring to FIG. 2, the optical distance between the wafer W and the lens 30 or between the wafer W and the pocket module 50 may be adjusted.

Figure 12A:
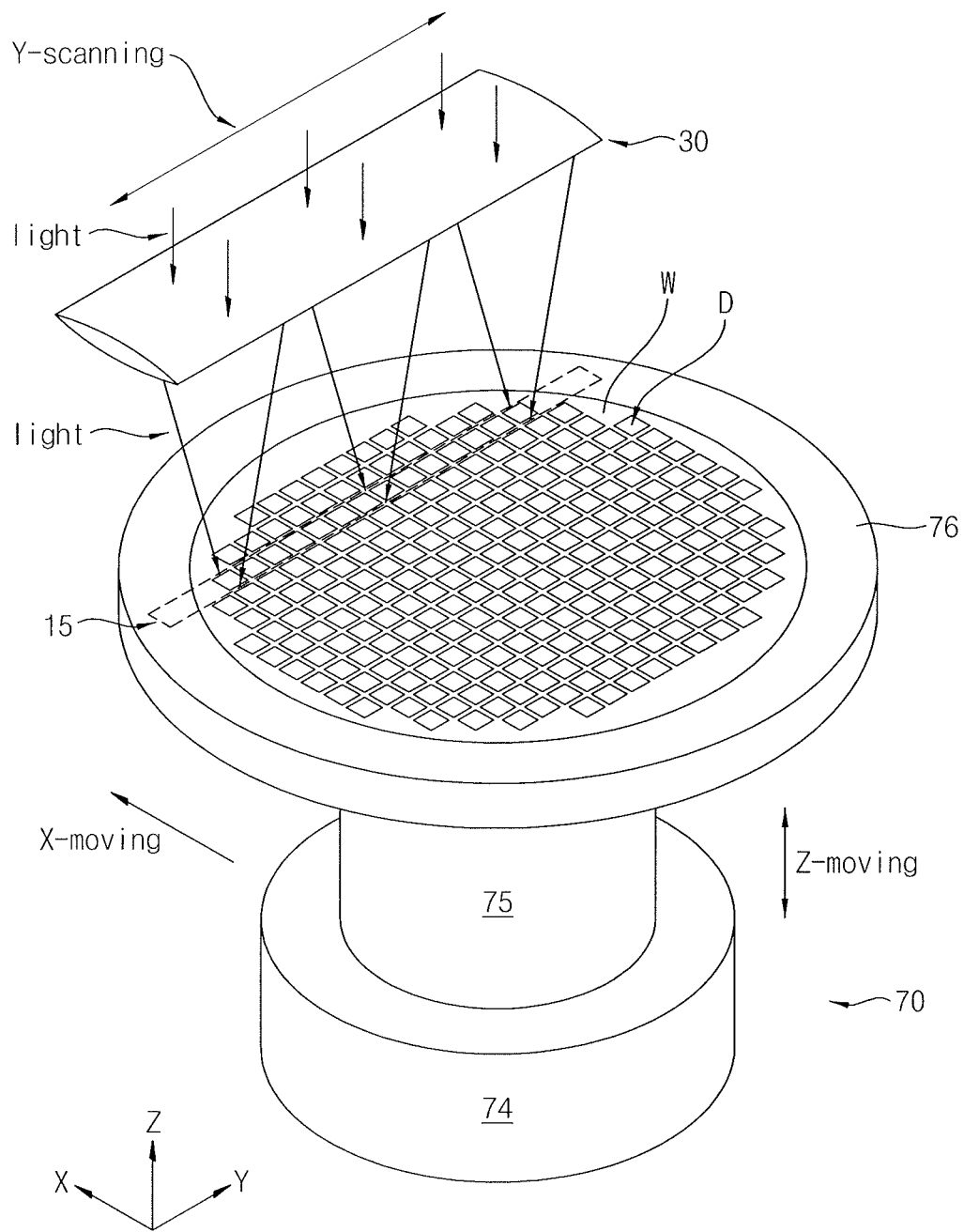
FIGS. 12A and 12B illustrate diagrams of performing a surface treatment process and/or a unit surface treatment process using a surface treatment section STS in accordance with an embodiment.
Figure 12B:
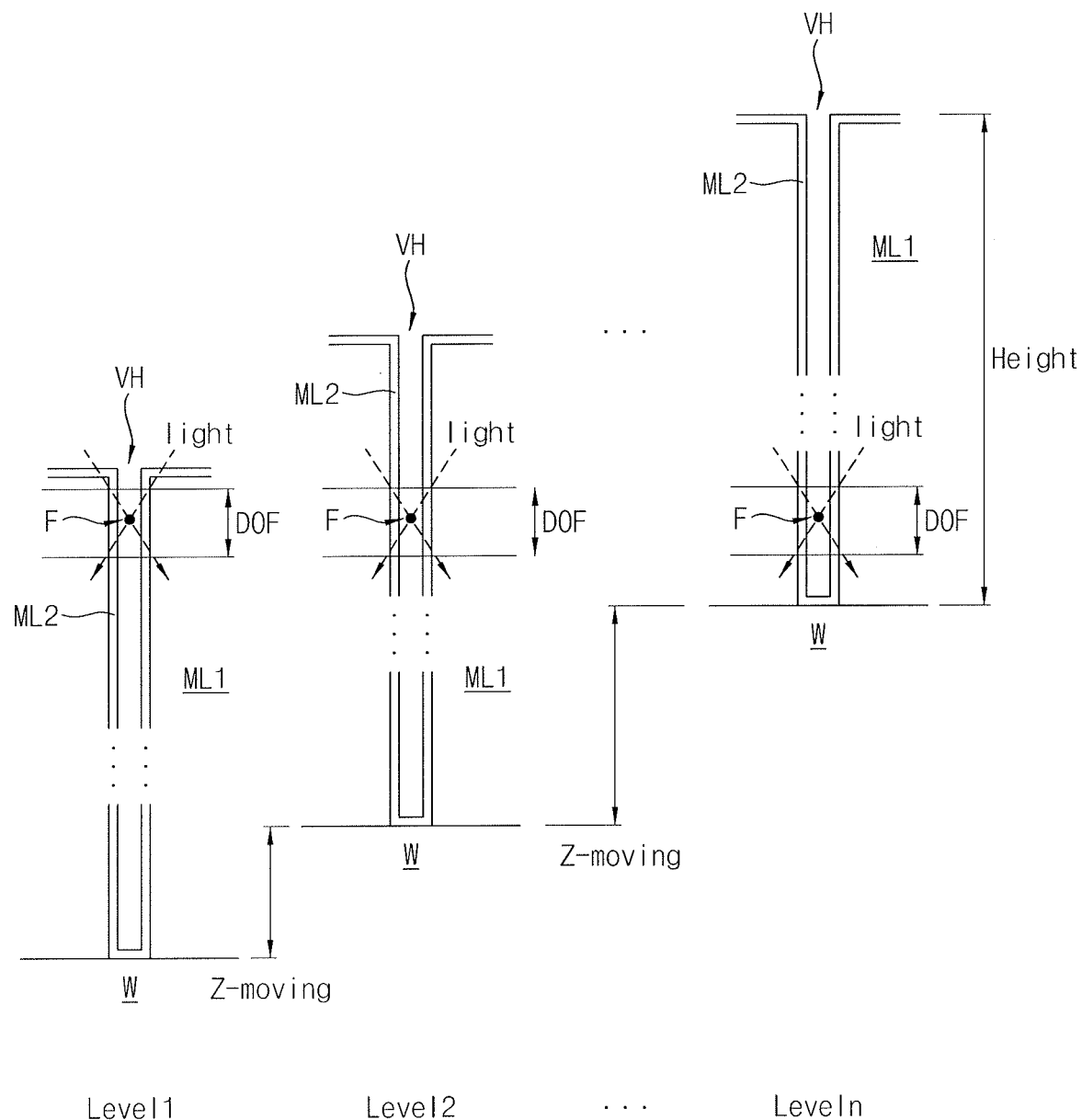
Figure 13:
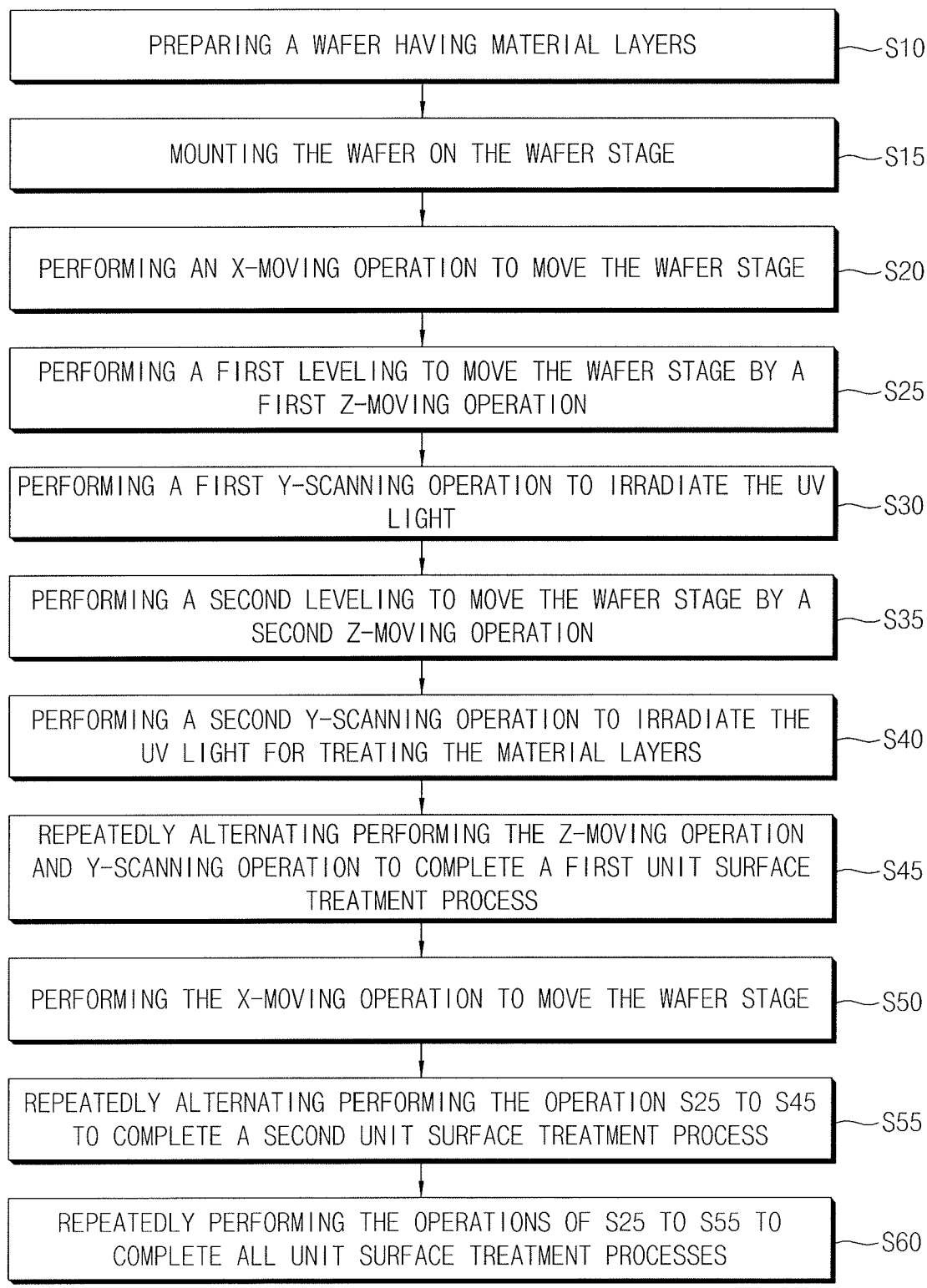
FIG. 13 illustrates a flowchart describing a method of performing a surface treatment process in accordance with an embodiment.

FIGS. 12A and 12B are diagrams illustrating performing a surface treatment process and/or a unit surface treatment process using the surface treatment section STS in accordance with an embodiment, and FIG. 13 is a flowchart describing a method of performing a surface treatment process in accordance with an embodiment.

Referring to FIGS. 12A and 12B, the UV illumination area 15 may be formed on the surface of the wafer W mounted on the wafer stage 76 by the lens 30. For example, a first region of the wafer W and the UV illumination area 15 of the lens 30 may be aligned. Referring to FIGS. 5A and 5B, the UV illumination areas 15a and 15b may include the focus line 36. The first region of the wafer W may be formed to include dies D arranged side-by-side on at least one column arranged in the Y-direction. In the drawing, the first region is included in the UV illumination area 15, and the reference numerals are omitted.

The UV illumination area 15 may have a width equal to or greater than the dies D arranged in the first region. In an embodiment, the UV illumination area 15 may include dies D in at least two columns arranged in the Y-direction. In an embodiment, the UV illumination area 15 includes portions of the dies D on one column arranged in the Y-direction. For example, the width of the UV illumination area 15 may be equal to or less than the width of the dies D.

The wafer stage 76 may move in X-direction or revolve. Referring to FIGS. 4A to 4E, the UV illumination area 15 may be formed by the light source 10 performing a scanning operation in the Y-direction. Therefore, the X-moving operation moving in the X-direction and the Y-scanning operation in which the light reciprocates in the Y-direction may be alternately performed. As shown in the drawing, the X-direction may be a first horizontal direction, and the Y-direction may be a second horizontal direction perpendicular to the first horizontal direction. The moving of the wafer stage 76 in the first horizontal direction, e.g., the left or right direction, or the revolving direction may be defined as an "X-moving operation", the moving of the light source 10 in the second horizontal direction may be defined as "Y-scanning", and the moving of the wafer stage 76 in the vertical (up and down) direction may be defined as a "Z-moving operation".

The surface treatment process may include a first unit surface treatment process, a second unit surface treatment process, and an n-th unit surface treatment process ("n" being a non-zero natural number, e.g., of 3 or more). The first unit surface treatment process may include moving the wafer stage 76 by the X-moving operation to align the dies D arranged in the first region (e.g., first column) on the wafer W with the UV illumination area 15, and irradiating light onto the dies D in the UV illumination area 15 by Y-scanning of the light source 10. The second unit surface treatment process may include moving the wafer stage 76 by the X-moving operation to align the dies D arranged in the second region (e.g., second column) on the wafer W with the UV illumination area 15, and irradiating light onto the dies D in the UV illumination area 15 by Y-scanning of the light source 10. In the same way, the n-th unit surface treatment process may include moving the wafer stage 76 by the X-moving operation to align the dies D arranged in an n-th region (e.g., an n-th column) on the wafer W with the UV illumination area 15, and irradiating light onto the dies D in the UV illumination area 15 by Y-scanning of the light source 10.

Each unit surface treatment process may include a plurality of Y-scans and a plurality of Z-moving operations. For example, each unit surface treatment process may include repeatedly alternating performing exposing the UV illumination area 15 of the wafer W to light with Y-scanning and leveling the wafer W using Z-moving operation to move the wafer stage 76 up and down. Thus, one area on the wafer W may be leveled many times and exposed to light many times. Moving the wafer stage 76 by the Z-moving operation so that the focus F of light may be positioned and aligned at an appropriate level of material layers ML1 and ML2 on the wafer W may be defined as "leveling" as shown in FIG. 12B.

Referring to FIGS. 12A, 12B, and 13, the surface treatment process in accordance with an embodiment may include preparing a wafer W having material layers ML1 and ML2 to be surface treated (e.g., a first material layer ML1 having a deep via hole VH and a second material layer ML2 formed on a surface of the deep via hole VH and the first material layer ML1) (S10), mounting the wafer W on the wafer stage 76 in the process section (S15), performing an X-moving operation to move the wafer stage 76 to be aligned a first region on the wafer W with a UV illumination area 15 of the lens 30 (S20), performing a first leveling to move the wafer stage 76 by a first Z-moving operation so that the focus F of a UV light is positioned at a first level (S25), performing a first Y-scanning operation to irradiate the UV light to the first region on the wafer W for treating the material layers ML1 and ML2 around the focus F of the first level (S30), performing a second leveling to move the wafer stage 76 by a second Z-moving operation so that the focus F of the UV light is positioned at a second level (S35), performing a second Y-scanning operation to irradiate the UV light to the first region on the wafer W for treating the material layers ML1 and ML2 around the focus F of the second level (S40), repeatedly alternating performing the Z-moving operation (leveling operation) and Y-scanning operation to complete a first unit surface treatment process with respect to the first region of the wafer W (S45), performing the X-moving operation to move the wafer stage 76 to be aligned a second region on the wafer with the UV illumination area 15 of the lens 30 (S50), repeatedly alternating performing the operation S25 to S45 to complete a second unit surface treatment process with respect to the second region of the wafer W (S55), and repeatedly performing the operations of S25 to S55 to complete all unit surface treatment processes for the entire surface of the wafer W (S60).

In each Y-scanning operation, the all foci F of light may be located at the same level. Thus, all of the foci F the light may be located at the same level, the wafer stage 76 may be moved up or down to be positioned the focus F of light at each of the levels, and the UV light may be irradiated to the material layers ML1 and ML2.

The depth of focus (DOF) is a value calculated based on the numerical aperture (NA) of the lens 30 and the wavelength ($\lambda$) of the light (DOF=2/NA). The depth of focus (DOF) means the vertical width at which the material layers ML1 and ML2 receive sufficient light energy.

The greater the numerical aperture (NA) of the lens 30, the greater the process efficiency may be. For a constant wavelength ($\lambda$) of UV light, the depth of focus (DOF) becomes small when the numerical aperture (NA) of the lens becomes greater.

Material layers ML1 and ML2 located at levels higher or lower than the depth of focus (DOF) may not receive enough light energy. Therefore, the material layers ML1 and ML2 located at the levels higher or lower than the depth of focus (DOF) may not be sufficiently surface treated. For example, when the numerical aperture (NA) of the lens 30 is greater than or equal to 0.6, the depth of focus (DOF) has a width of about 1 to 6 µm mainly depending on the wavelength (1) of light to be used, while the material layers ML1 and ML2 are not less than several tens of µm, the material layers ML1 and ML2 are not sufficiently surface treated.

However, in accordance with an embodiment, all portions of the material layers ML1 and ML2 may receive sufficient light energy by performing process while the wafer W is lifted or lowered in the Z-direction. Therefore, even if the depth of focus DOF is significantly smaller than the total height of the material layers ML1 and ML2, the surface treatment processes for the material layers ML1 and ML2 may be performed sufficiently by raising and lowering the wafer stage 76. The surface treatment processes may drain gases and densify the material layers ML1 and ML2 to induce a stoichiometrically stable bond. When the surface treatment process is insufficiently performed, more defects may appear in the material layers ML1 and ML2, and the material layers ML1 and ML2 may not be densified or may have a negative influence on a subsequent process. For example, the material layers ML1 and ML2 may not sufficiently support a metal pattern, so that the metal patterns may break or collapse.

Figure 14:
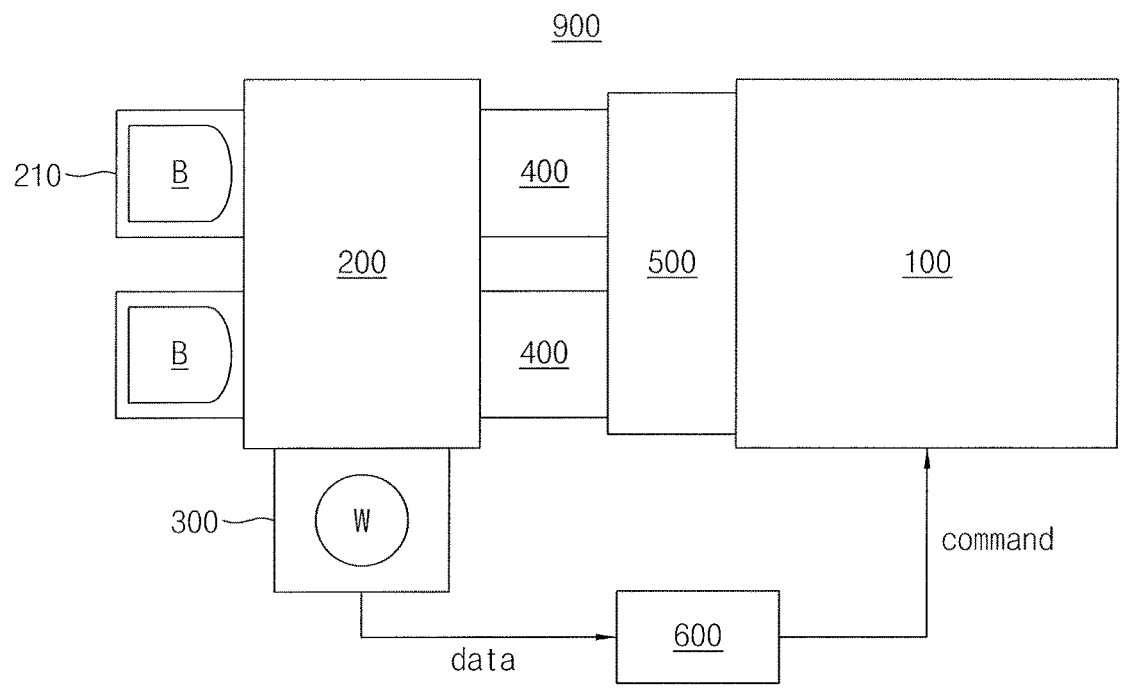
FIG. 14 illustrates a schematic top view of a semiconductor manufacturing apparatus in accordance with an embodiment.

FIG. 14 is a top view schematically illustrating a semiconductor manufacturing apparatus 900 in accordance with an embodiment.

Referring to FIG. 14, a semiconductor manufacturing apparatus 900 in accordance with an embodiment may include a stock module 200, a measuring module 300, a load-lock module 400, a transfer module 500, a process controller 600, and an ALD apparatus 100.

The stock module 200 may include shelves 210 in which a wafer shipping box B, such as a front open unified pod (FOUP), is placed. For example, the stock module 200 may include a wafer transfer device, such as an Equipment Front End Module (EFEM). The stock module 200 may transfer and distribute the wafers W in the wafer shipping box B to the apparatuses to be processed by various processes. For example, the stock module 200 may transfer the wafers W in the shipping box B to the measuring module 300 or the load-lock module 400, or may transfer the wafers W from the measuring module 300 or the load-lock module 400 to the wafer shipping box B on the shelf 210. Thus, the stock module 200 may include a transfer system, such as a robot arm.

The measuring module 300 may generate various databases by measuring various structural and physical differences of the wafer W. For example, the measuring module 300 may measure a warpage and surface profile of the wafer W to create a warpage database and a surface profile database. In an embodiment, the warpage information and surface profile information measured by the measuring module 300 may be sent to the process controller 600 and transformed into various databases in the process controller. A notch alignment process for aligning the notches (N, refer to FIGS. 18A and 18B) of the wafers W in the measuring module 300 may be performed. In an embodiment, the notch alignment process may be performed in the stock module 200.

The load-lock module 400 may be positioned between the stock module 200 and the transfer module 500, and may adjust a vacuum degree of the inside before transferring the wafer W from the stock module 200 to the transfer module 500 or from the transfer module 500 to the stock module 200.

The transfer module 500 may transfer the wafer W from the load-lock module 400 to the ALD apparatus 100 or from the ALD apparatus 100 to the load-lock module 400.

A process of cleaning the surface of the wafer W, a process of depositing a material layer on the wafer W, a process of surface treating the deposited material layer, or various other processes may be performed selectively and sequentially in the ALD apparatus 100. For example, the ALD apparatus 100 may refer to one of the ALD apparatuses 100A to 100H described with reference to FIGS. 1A to 1H.

Figure 15:
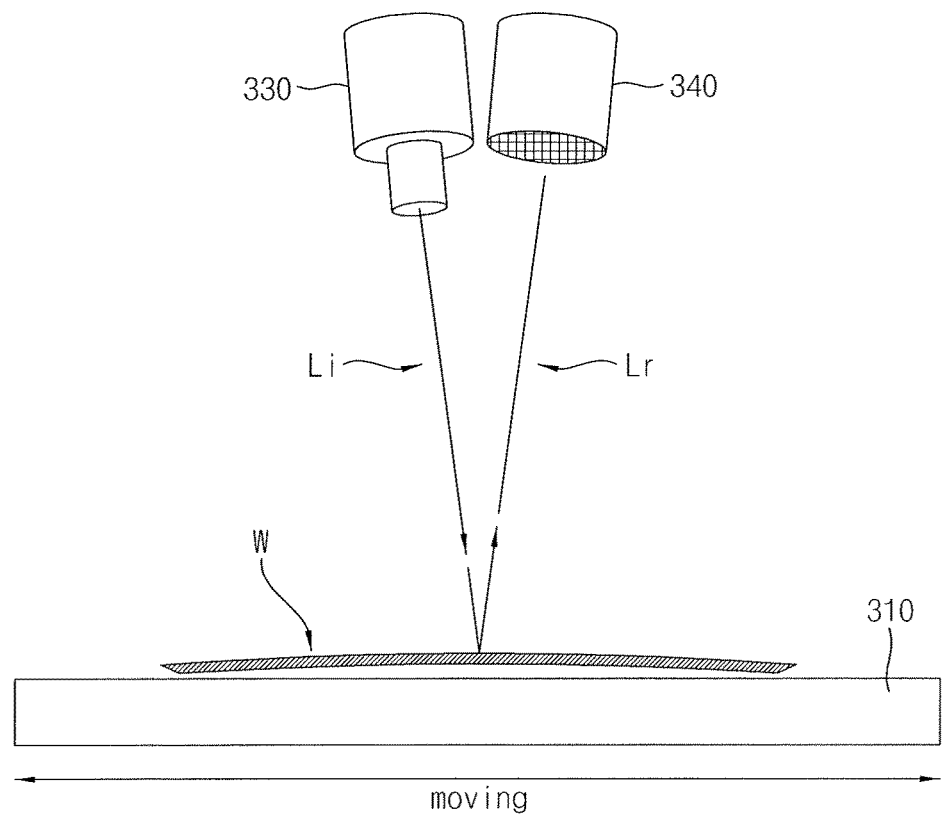
FIG. 15 illustrates an example measurement process performed within a measuring module in accordance with an embodiment.

FIG. 15 illustrates an example measurement process performed within the measuring module 300 in accordance with an embodiment.

Referring to FIG. 15, for example, a process of measuring the warpage and/or the surface level profile of the wafer W may be performed in the measuring module 300. The process of measuring the warpage and/or the surface level profile of the wafer W may be performed by irradiating incident light Li from the light source 330 onto the surface of the wafer W mounted on the wafer measuring stage 310, and receiving reflected light Lr reflected from the surface of the light receiving portion 340. The light source 330 may irradiate the light Li having a wavelength of visible light or ultraviolet light to the surface of the wafer W. The light receiving portion 340 may detect a phase of the reflected light Lr reflected from the surface of the wafer W. The wafer measuring stage 310 may horizontally move in the X-direction and the Y-direction. Therefore, the light irradiated from the light source 330 may scan the entire surface of the wafer W. The measuring module 300 may measure and determine a degree of warpage and the surface level profile of the wafer W based on phase differences of the reflected light Lr sensed by the light receiving portion 340 based on positions of the wafer W. In the drawing, it is assumed that the wafer W has a convex warpage.

The warpage data and the surface level profile data of the wafer W measured by the measuring module 300 may be transformed into a coordinate map in the measuring module 300. The wafer surface level profile data may include surface level information and wafer warping information for each location of the wafer. The surface level profile data may be sent to the process controller 600, which may generate surface level correction data based on the surface level profile data. The surface level profile correction data may include a rotation moving value $\Delta\Phi$ of the wafer W and a Z-moving correction value $\Delta Z$ depending on the position. The process controller 600 may control the process in accordance with the rotation moving value $\Delta\Phi$ of the wafer W and the Z-moving correction value $\Delta Z$ depending on the position. For example, the process controller 600 may provide instructions for controlling the process to align the wafers W by rotation or move them vertically based on the position of the wafers W to the ALD apparatus 100.

Figure 16:
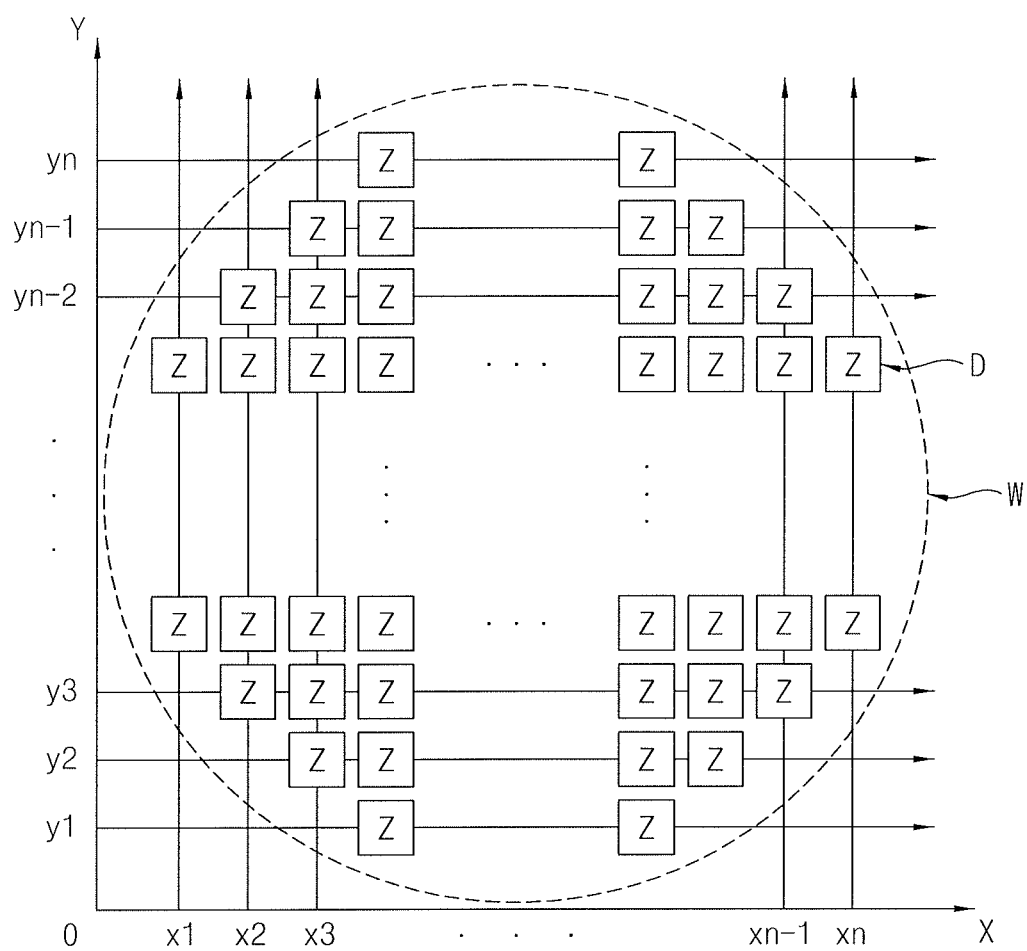
FIG. 16 conceptually illustrates surface level profile data created by the measuring module in accordance with an embodiment.

FIG. 16 conceptually illustrates surface level profile data created by the measuring module 300 in accordance with an embodiment.

Referring to FIG. 16, the surface level profile data (coordinate map) may have a profile of the surface level of the wafer W, for example, a surface level information value (z) based on intersections where the parallel columns (y1=yn) and the parallel rows (x1 to xn). The surface level information z may have relative values compared to a reference value (referred to as z0). For example, when the level information value z is a positive (+) value, the level of the surface of the wafer W at the specific coordinate may be interpreted as being higher than the reference value z0, and the level information value z is a negative (−) value, the level of the surface of the wafer W at the specific coordinate may be interpreted as being lower than the reference value z0. In another embodiment, when the level information value z is the positive (+) value, the level of the surface of the wafer W at the specific coordinate may be interpreted as being lower than the reference value z0, and the level information value z is a negative (−) value, the level of the surface of the wafer W at the specific coordinate may be interpreted as being lower than the reference value z0.

In an embodiment, the spacing between rows x1 to xn and the spacing between columns y1 to yn may be set to correspond to a horizontal width and a vertical width of one die D. For example, the intersections of the rows (x1 to xn) and columns (y1 to yn) may each be located within one die (D). In an embodiment, two or more intersections may be located within one die D. For example, the spacing between rows x1 to xn and the spacing between columns y1 to yn may be less than the horizontal width and the vertical width of one die D. In an embodiment, the spacing of the rows x1 to xn and the spacing between the columns y1 to yn may be greater than the horizontal width and vertical width of one die D. In the drawing, for example, the spacing between the rows x1 to xn and the spacing between the columns y1 to yn are set to correspond to the horizontal width and the vertical width of one die D, respectively.

Figure 17A:
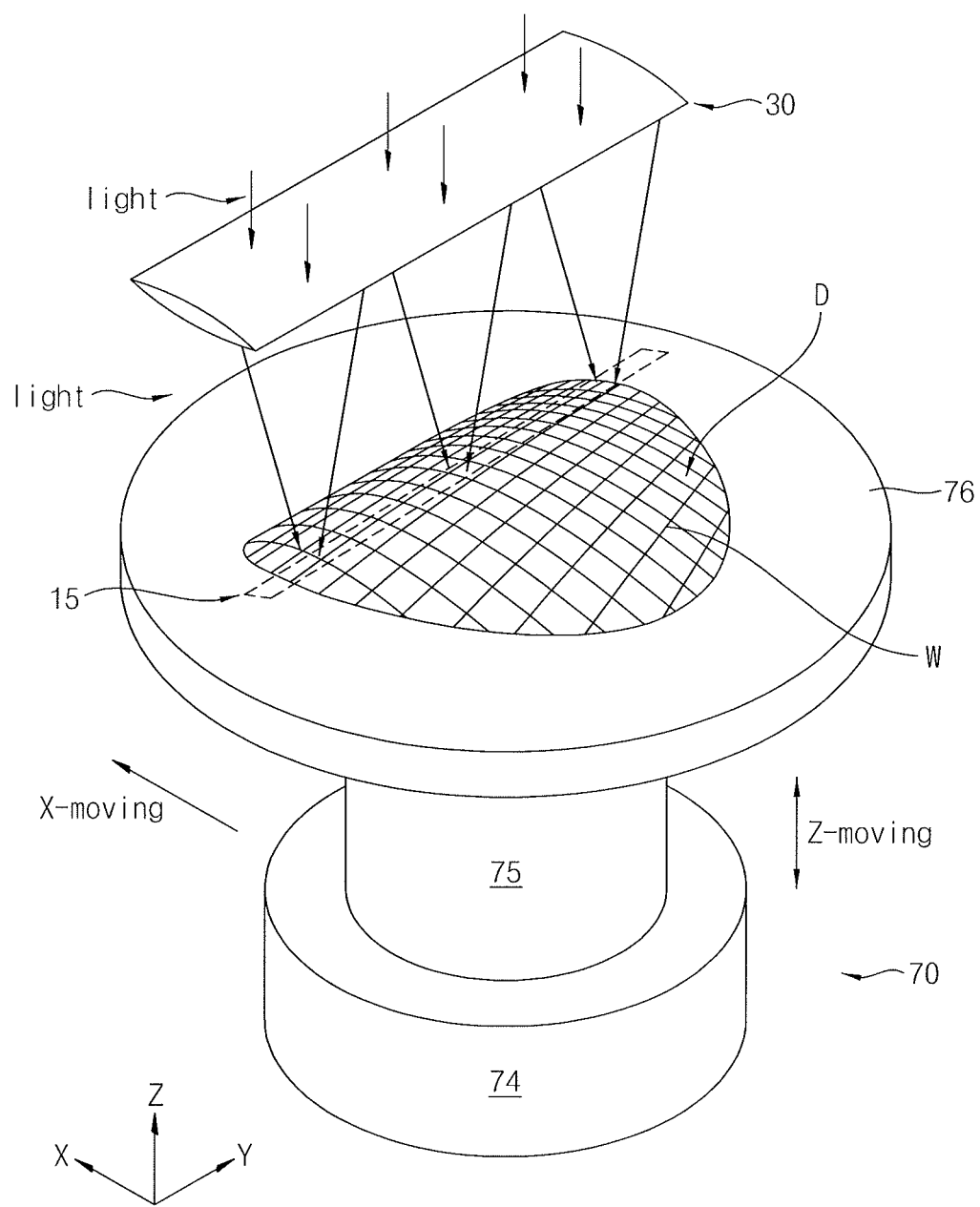
FIGS. 17A and 17B schematically illustrate a surface treatment after forming a material layer on the wafer having a warpage in accordance with an embodiment.
Figure 17B:
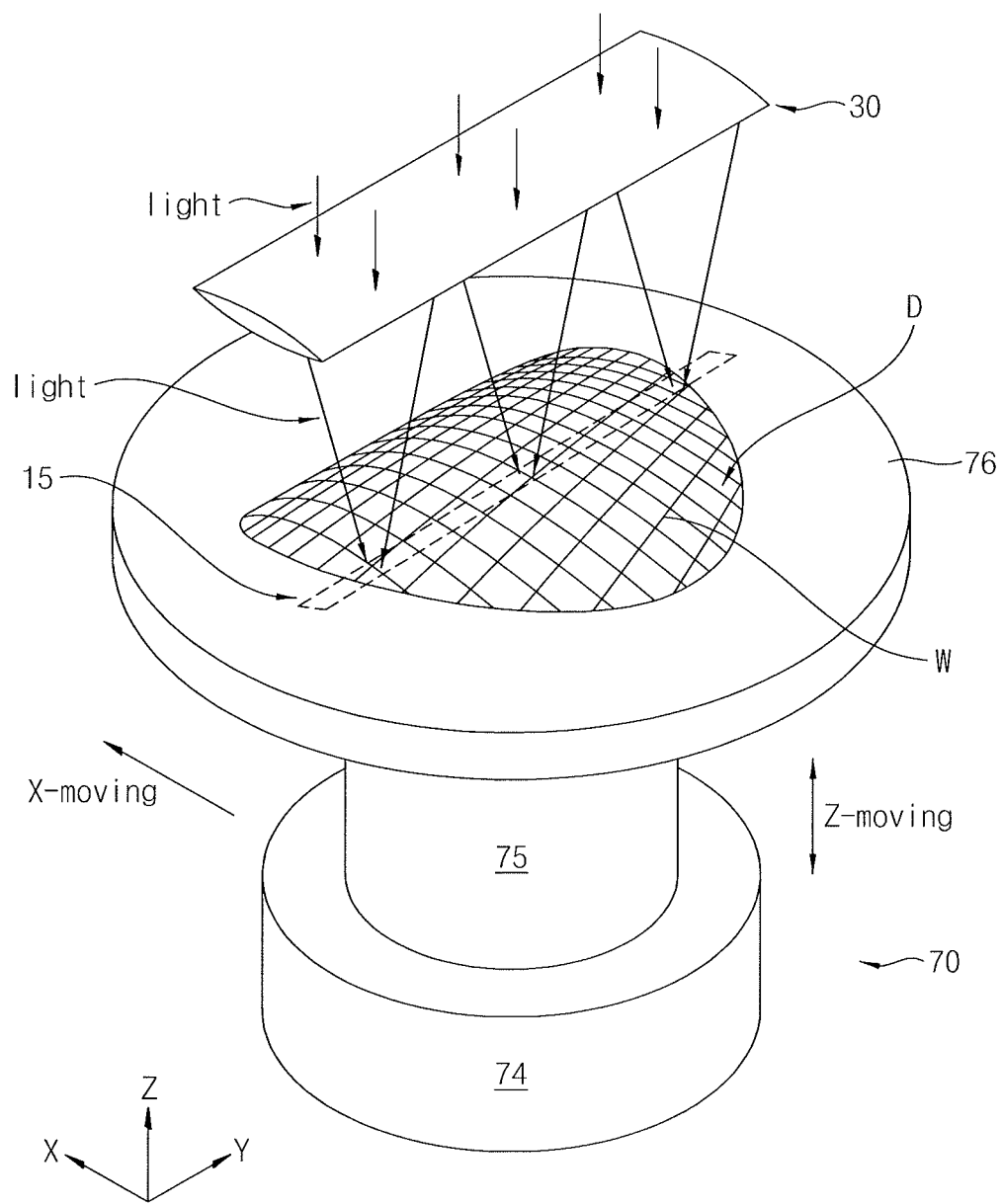

FIGS. 17A and 17B schematically illustrate a surface treatment after forming a material layer on the wafer W having a warpage in accordance with an embodiment.

Referring to FIGS. 17A and 17B, the surface treatment process may be performed based on the warpage information of the wafer W. For example, the warpage information obtained by analyzing the surface level profile data of the wafer W may be used such that the dies D having the same surface level based on the warping information may be simultaneously surface treated.

In general, when the wafer W is warped, the wafer W has a one-dimensional bending direction. The wafer W may be aligned on the wafer stage 76 so that the same surface level direction due to the warpage of the wafer W may be parallel or coincident with the UV illumination area 15. This allows the surface treatment process to be carried out with the dies D exposed to the UV illumination area 15 being positioned at substantially the same level, even if the wafer W has warpage. The "warpage direction" of the wafer W is a direction in which the dies D are arranged to have the same surface level (or the surface levels of the wafer W are the same in the direction). As shown in FIGS. 17A and 17B, the "warpage direction" of the wafer W is the same as the direction in which the UV illumination area 15 is elongated.

The wafer warpage information may include a difference in angle between the warpage direction of the wafer W and the elongated direction of the UV illumination area 15. For example, if the wafer W is rotated by the correction angle difference, the warpage direction of the wafer W and the elongated direction of the UV illumination area 15 will be aligned and coincident.

Referring to FIG. 17A, a primary surface treatment process may be performed to treat the surface of the dies D of the wafer W located at the first level. For a wafer W on the wafer stage 76, the primary surface treatment process may include performing an X-moving operation to align the UV illumination area 15 (or the focus line 36 shown in FIG. 5A or 5B) with the wafer W, performing a first leveling operation based on the surface level profile correction data so that the UV illumination area 15 is positioned at an appropriate level of the wafer W, and performing a Y-scanning operation to irradiate the UV light to the dies D located on the same column of the wafer W. For example, the primary leveling operation may include moving the wafer stage 76 up or down using the lower cylinder part 74 and the upper piston part 75 so that the UV illumination area 15 (or the focus line 36) may be formed within the wafer W or on the material layer of the wafer W.

Subsequently, referring to FIG. 17B, a secondary surface treatment process may be performed to treat the surface of the dies D of the wafer W located at the second level. After the primary surface treatment process is performed, the secondary surface treatment process may include performing the X-moving operation to move the wafer stage 76, performing a second leveling operation based on the surface level profile correction data so that the UV illumination area 15 is positioned at an appropriate level of the wafer W, and performing the Y-scanning operation to irradiate the UV light to the dies D located on the same column of the wafer W. For example, the secondary leveling operation may include moving up or down the wafer stage 76 by using the lower cylinder part 74 and the upper piston part 75 so that the UV illumination area 15 (or the focus line 36) may be formed within the moved wafer W or on the material layer on the wafer W. As illustrated, the second level is set lower than the first level. Thus, the second leveling operation may include raising the wafer stage 76. When the second level is higher than the first level, the secondary leveling operation may include lowering the wafer stage 76.

Thereafter, additional surface treatment processes may be performed continuously based on the surface level profile correction data. In accordance with the embodiment, since the leveling operation for forming the UV illumination area 15 and the focus line 36 at an appropriate level is performed even if the wafer W has a surface height difference or warpage at various positions, uniform light energy may be supplied over the entire surface. Therefore, surface treatment process having excellent uniformity may be performed.

In addition, as shown in FIGS. 17A and 17B, when a direction in which the dies D are arranged on the wafer W and the wafer warpage direction do not coincide with each other, the surface treatment process may be performed based on the wafer bending direction. In general, the surface treatment process may be performed after aligning the direction of the arrangement of the dies D on the wafer W (e.g., the column direction) and the direction of the UV illumination area 15 based on a notch alignment process for aligning the wafers W in a predetermined direction.

However, in an embodiment, regardless of the direction in which the dies D are arranged on the wafer W, the surface treatment process may be performed after the warping direction of the wafer and the elongated direction of the UV illumination area 15 are aligned and are coincident.

Figure 18A:
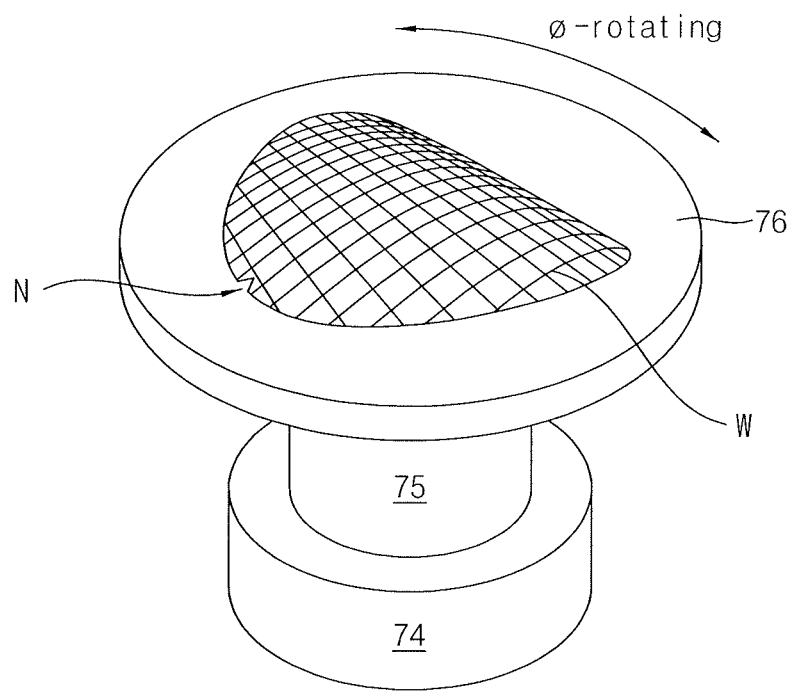
FIGS. 18A and 18B illustrate rotating the wafer to be aligned.
Figure 18B:
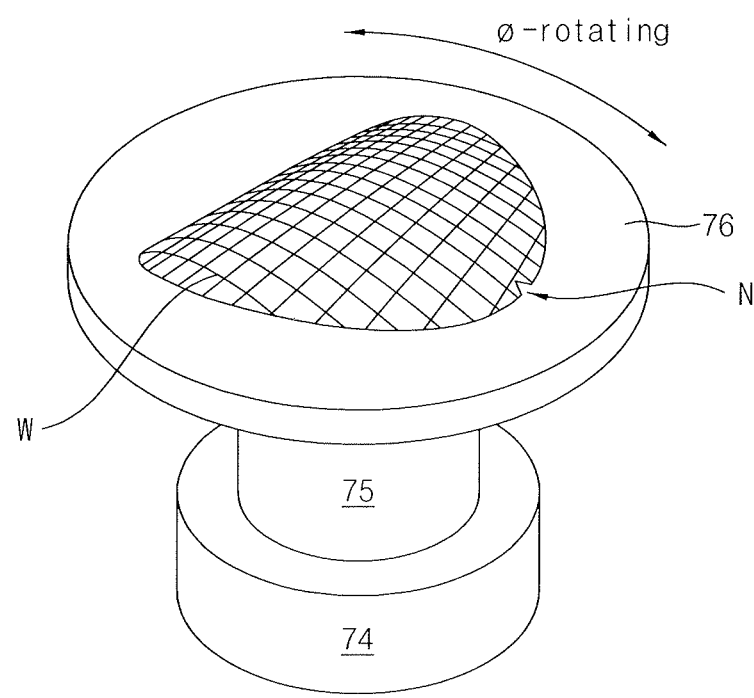

FIGS. 18A and 18B illustrate rotating the wafer W to be aligned.

Referring to FIG. 18A, the same surface level direction due to the warpage of the wafer W does not coincide with the elongated direction (e.g., the Y-direction) of the UV illumination area 15. In this case, the surface treatment process described with reference to FIGS. 12A, 12B, 17A, and 17B may be difficult to perform, as the UV illumination area 15 or the focus line 36 may not be uniformly formed at the same level on the wafer W.

Among the processes of processing the wafer W, the notch alignment process may be performed to align the notch N so that the wafer W is always mounted uniformly. In the surface treatment processes described with reference to FIGS. 12A, 12B, 17A, and 17B, the description of the notch alignment process is omitted, or the warpage direction of the wafer W may coincide with the notch alignment direction.

Referring back to FIGS. 18A and 18B, when the same surface level direction due to the warpage of the wafer W does not coincide with the notch aligning direction, a notch moving alignment process for moving the notch N to an arbitrary position may be performed. For example, the modified notch moving alignment process may be performed by rotating the wafer stage 76 clockwise or counterclockwise. In an embodiment, the notch moving alignment process may be performed before the wafer W is mounted on the wafer stage 76. For example, the notch moving alignment process may be performed in the deposition sections DSx shown in FIGS. 1A to 1H, and the alignment may be maintained in the surface treatment section STS. In an embodiment, the notch moving alignment process may be performed in a separate notch alignment process module after the material layer is formed on the wafer W in the deposition sections DSx shown in FIGS. 1A to 1H. Adjusting the direction in which the dies D positioned at the same level based on the warpage of the wafer W and the direction in which the UV illumination area 15 elongated to be in parallel with each other may be defined as an align match process FIGS. 19A and 19B illustrate a surface treatment process in accordance with an embodiment.

Figure 19A:
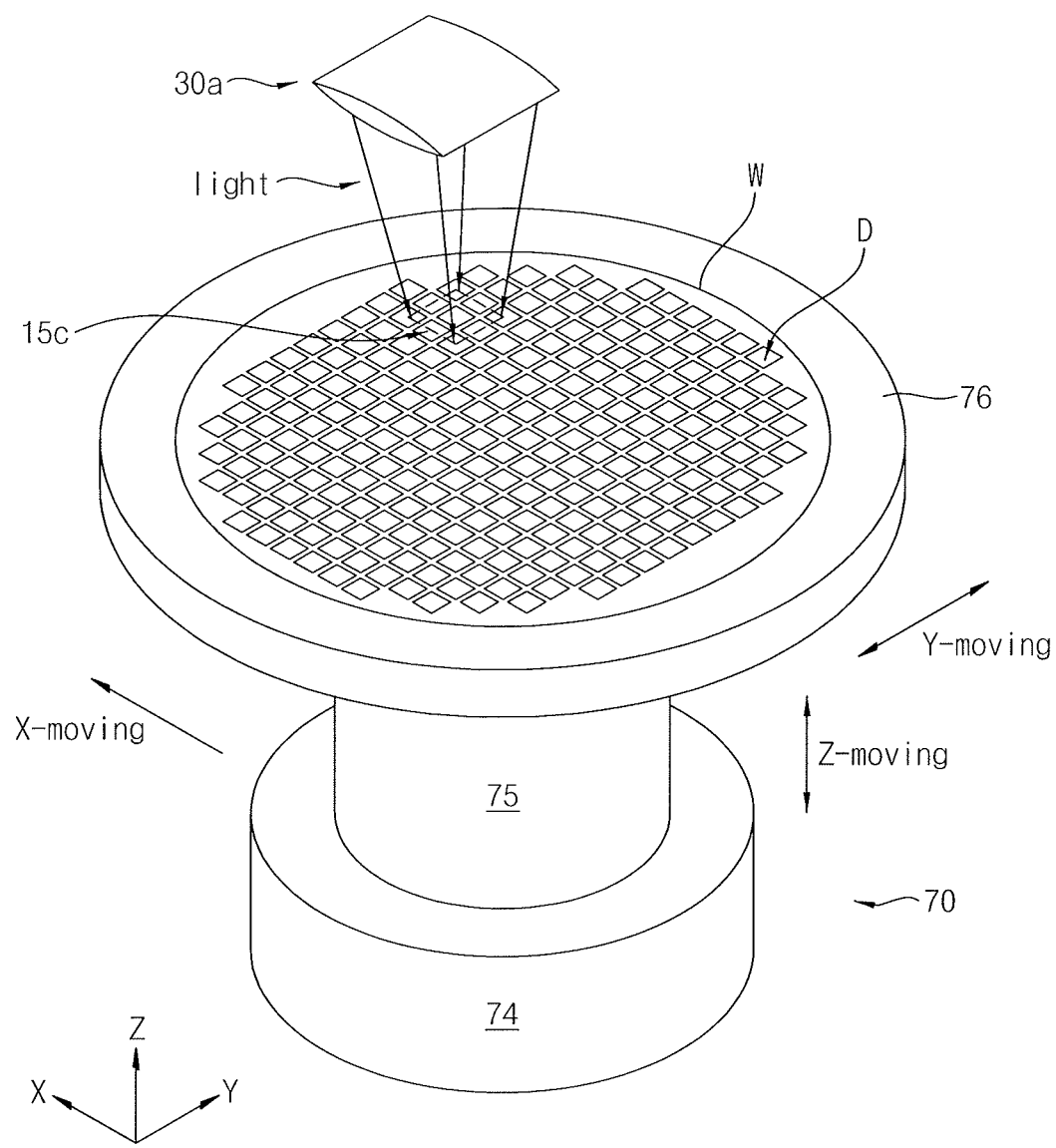
FIGS. 19A and 19B illustrate a surface treatment process in accordance with an embodiment.
Figure 19B:
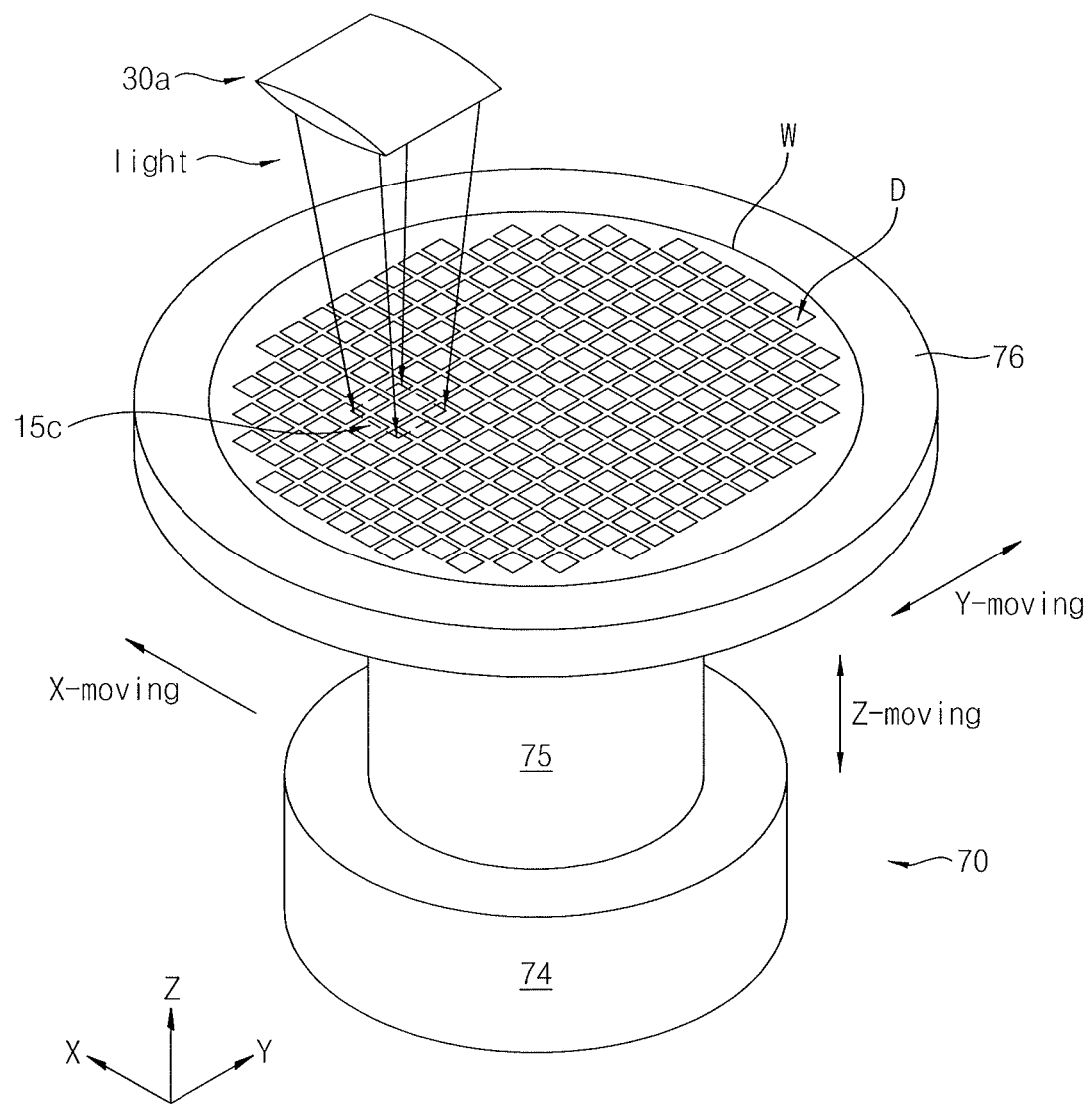

First, the surface treatment process shown in FIGS. 19A and 19B may be performed using the point light source 10a or the UV illumination area 15a formed by the bar-shape light source 10b. In an embodiment, the lens 30a may be a short bar-shape cylinder lens, a hemi-spherical cylinder lens, or a circular lens. The short bar-shape lens is illustrated by way of example.

Therefore, the short bar-shape UV illumination area 15a formed by a short bar-shape lens 30a may be formed. In the drawing, the UV illumination area 15a is shown as a square.

In an embodiment, in the top view, the UV illumination area 15a may be circular shape formed by a circular lens.

The UV illumination area 15a may cover one or several adjacent dies D on the wafer W.

Referring to FIG. 19A, a first surface treatment process may be performed with respect to the dies D of the wafer W. The first surface treatment process may include surface treating the dies D arrayed and aligned in one UV illumination area 15a. First, the first surface treatment process may be performed after aligning the first region on the wafer W with the US illumination region 15a by the light source 10a by selectively performing the X-moving operation, Y-scanning operation, and Z-moving operation of the wafer stage 76. During the first surface treatment process, the wafer stage 76 may perform the Z-moving operation to ascend or descend. The Y-moving operation may include moving the wafer stage 76 in the Y-direction. In an embodiment, the Y-moving operation may include moving the light source 10a.

Referring to FIG. 19B, after the first surface treatment process, the wafer stage 76 is moved by at least one the X-moving operation, the Y-moving operation, or the Z-moving operation, and a second surface treatment process may be performed. It is shown that the second surface treatment process is performed after the wafer stage 76 has been moved by at least one the X-moving operation and the Y-moving operation.

Thus, for the wafers W having various surface heights by position, the surface treatment processes may be repeated with appropriate energy at an appropriate level based on the level of each die D.

Figure 20A:
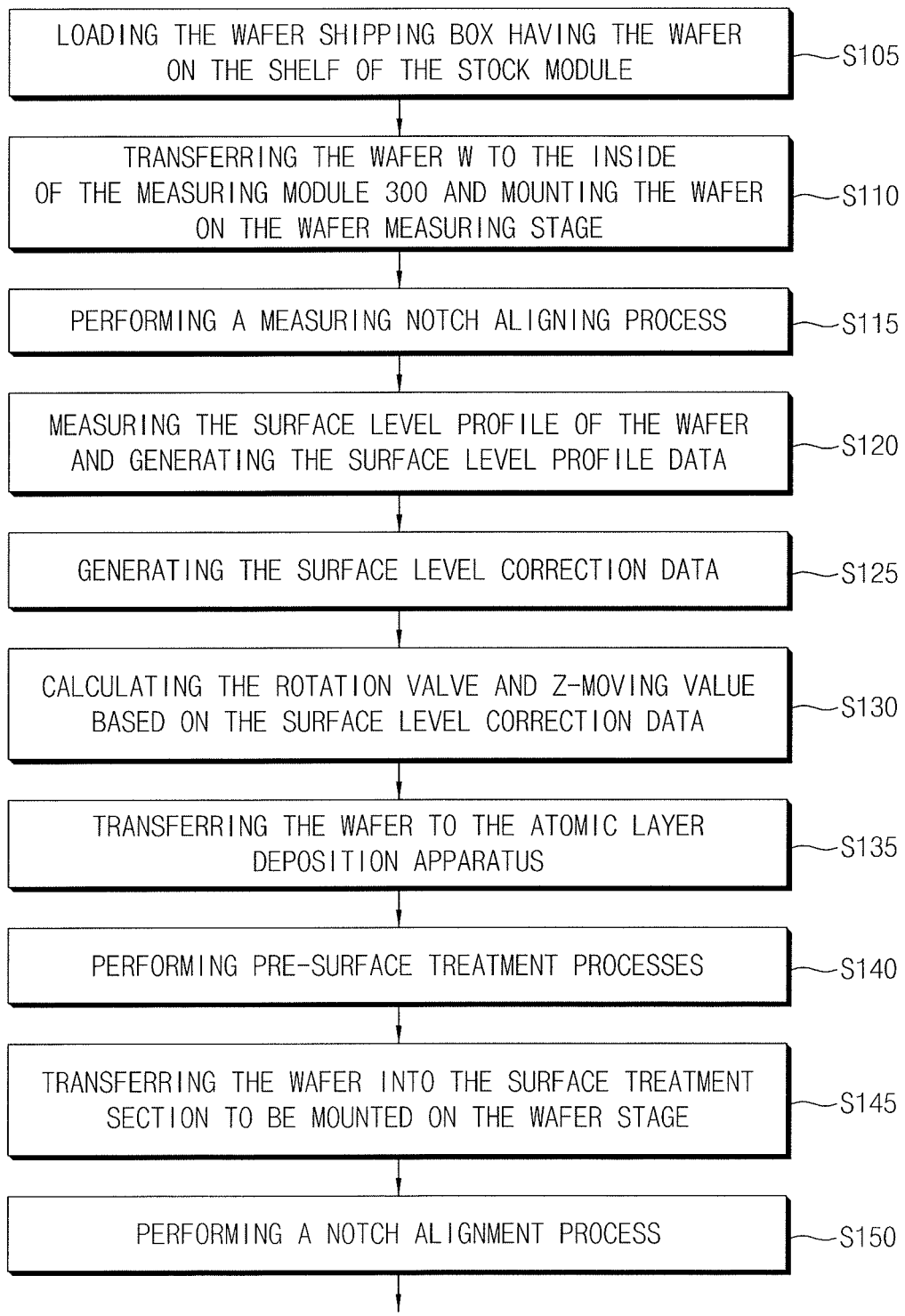
FIGS. 20A to 20C illustrate flowcharts of performing a semiconductor manufacturing process including the surface treatment process described with reference to FIGS. 15 to 19B using the semiconductor manufacturing apparatus described with reference to FIG. 14.
Figure 20B:
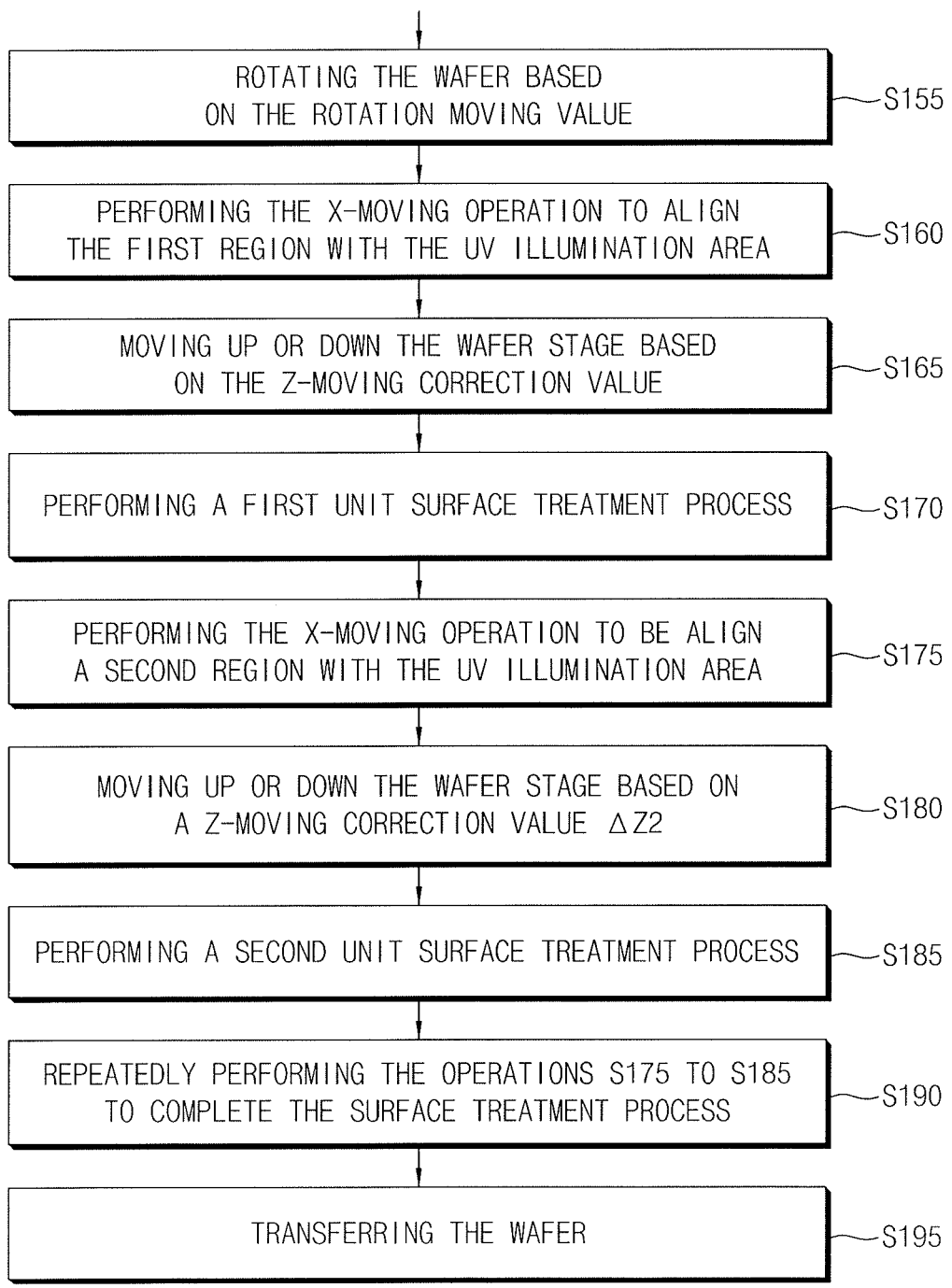
Figure 20C:
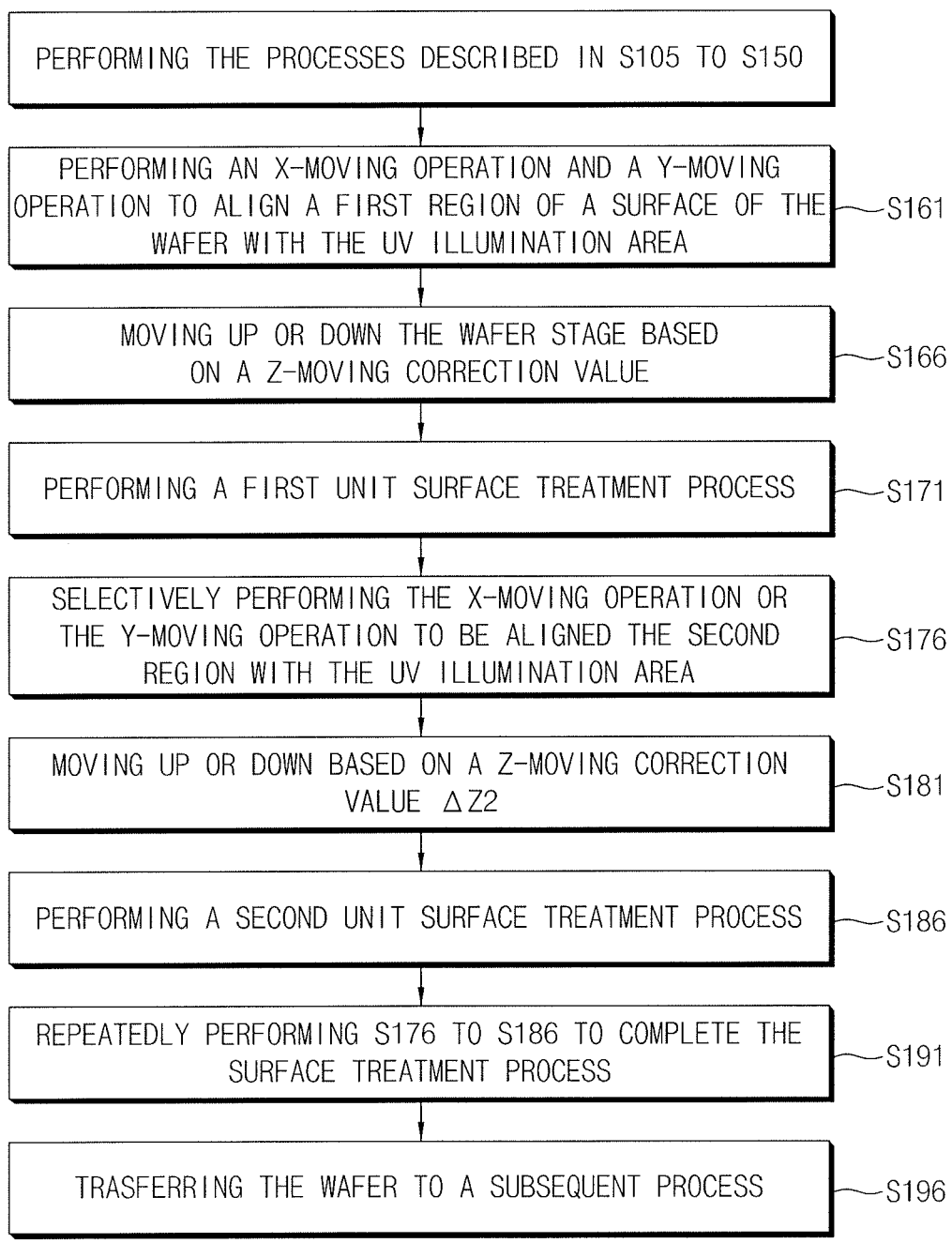

FIGS. 20A to 20C are flowcharts illustrating performing a semiconductor manufacturing process including the surface treatment process described with reference to FIGS. 15 to 19B using the semiconductor manufacturing apparatus 900 described with reference to FIG. 14.

As an example, it is explained that the surface treatment process of the wafer W proceeds based on the warpage information and/or the surface profile information of the wafer W.

Further reference may be made to the ALD apparatuses 100A to 100F described with reference to FIGS. 1A to 1C.

First, referring to FIGS. 14 to 18B, and 20A and 20B, a semiconductor manufacturing process in accordance with an embodiment may include loading the wafer shipping box B having the wafer W on the shelf 210 of the stock module 200 (S105), transferring the wafer W in the wafer shipping box B to the inside of the measuring module 300 and mounting the wafer W on the wafer measuring stage 310 in the measuring module 300 (S110), performing a measuring notch aligning process for measurement to aligning the notch N of the wafer W with the reference direction of the wafer measuring stage 310 (S115), measuring the surface level profile of the wafer W and generating the surface level profile data of the wafer W (S120), generating the surface level correction data of the wafer W based on the surface level profile data of the wafer W (S125), calculating the rotation valve $\Delta\Phi$ and Z-moving value $\Delta Z$ of the wafer W based on the warpage information of the wafer W based on the surface level correction data of the wafer W (S130), transferring the wafer W from the measuring module 300 to the ALD apparatus 100 through the load-lock module 400 and the transfer module 500 (S135), performing pre-surface treatment processes such as a cleaning process for cleaning the surface of the wafer W and a deposition process for depositing a material layer on the wafer in the ALD apparatus 100 (140), transferring the wafer W into the surface treatment section STS to be mounted on the wafer stage 76 (S145), performing a notch alignment process for the surface treatment to align the notch N of the wafer W with the reference direction of the wafer stage (S150), rotating the wafer W based on the rotation moving value $\Delta\Phi$ of the wafer W (S155), performing the X-moving operation to move the wafer stage 76 in the X-direction to align the first region of the surface of the wafer W with the UV illumination area 15 (S160), moving up or down the wafer stage 76 based on the Z-moving correction value $\Delta Z1$ of the first region to level the first region of the surface of the wafer W to the UV illumination area 15 or the focus line 36 (S165), performing a first unit surface treatment process with respect to the first region of the surface of the wafer W (S170), performing the X-moving operation to move the wafer stage 76 in the X-direction to be align a second region of the surface of the wafer W with the UV illumination area 15 (S175), moving up or down the wafer stage 76 based on a Z-moving correction value $\Delta Z2$ to level the second region of the surface of the wafer W at the UV illumination area 15 or the focus line 36 (S180), performing a second unit surface treatment process with respect to the second region of the surface of the wafer W (S185), repeatedly performing the operations S175 to S185 to complete the surface treatment process for the entire surface of the wafer W (S190), and transferring the wafer W (S195).

A subsequent process may form another material layer on the surface of the wafer W in the deposition section DS. In an embodiment, the subsequent process may include processes performed outside the ALD apparatus 100.

In S115, the reference direction of the wafer measuring stage 310 may be a direction mechanically set in the measuring module 300. In S115 and S150, the notch alignment process may include a flat-zone alignment process.

In S120 and S125, the surface level profile data of the wafer W may be generated by the measuring module 300 or the process controller 600. For example, the measuring module 300 may include a computer or a micro-processor (MP) to generate surface level profile data for the wafer W, or the process controller 600 may include a micro-processor (MP) for generating surface level profile data of the surface level profile data of the wafer W.

In S130, the rotation moving value $\Delta\Phi$ of the wafer W and the Z-moving correction value $\Delta Z$ depending on the coordinates of the wafer W may be calculated by the ALD apparatus 100 or the process controller 600. For example, the ALD apparatus 100 may include a computer or a micro-processor for calculating the rotation moving value $\Delta\Phi$ and the Z-moving correction value $\Delta Z$ of the wafer W, or the process controller 600 may include a computer or a micro-processor for calculating the values $\Delta\Phi$ and $\Delta Z$.

In an embodiment, Z-moving correction values $\Delta Z1$ and $\Delta Z2$ may be the height from a pre-set reference level Z0 to the surface levels of the wafer W of each coordinate. The pre-set reference level Z0 may be the average surface level of the wafers W measured and calculated for previously treated wafers W. For example, the pre-set reference level Z0 may be measured and accumulated by the wafer W surface level measuring process, which is repeatedly performed, and the number of surface levels of the wafers W calculated by an averaging or 6-sigma method. In an embodiment, the pre-set reference level Z0 may be modified by adding and averaging the measured surface level of wafers W each time or a set number of times the surface level of the wafers W.

The rotation moving value $\Delta\Phi$ of the wafer W may include a wafer warpage correction value calculated based on the wafer surface level profile data. The rotation moving value $\Delta\Phi$ of the wafer W may be calculated by analyzing the level tendency of the surface level profile data of the measured wafer W. For example, the rotation moving value $\Delta\Phi$ of the wafer W may include an angle to rotate the wafer W. Owing to the rotation, the direction formed by the surfaces of the wafers positioned at the same level based on the warpage of the wafer W and the elongated direction of the UV illumination area 15 may be parallel with each other. When the warpage direction of the wafer W and the elongated direction of the UV illumination area 15 are aligned, the dies D exposed in the UV illumination area 15 may be located at substantially the same level.

In addition, the process controller 600 may analyze the tendency of the surface level profile of the wafer W and reflect it on various processes. For example, if the warpage direction of the wafer W is analyzed to have a constant tendency by the accumulated surface level profile data, it is possible to feed back the wafer W to modify the alignment direction when machining the wafer W in other processes. In addition, when the Z-moving correction values $\Delta Z$ of the wafer W also have a position-specific tendency, they may be fed back to modify the alignment direction when processing the wafer W in other processes.

In S140, the cleaning process and/or the deposition process may be omitted. For example, the ALD apparatus 100 may be a surface treatment section STS.

In S155, the rotation moving of the wafer W may be omitted. For example, if the surface profile of the wafer W is uniform enough to be within an error tolerance range, or if the rotation moving value $\Delta\Phi$ of the wafer W is small enough to be ignored, the rotation moving may not be performed and a subsequent processes may be performed.

Next, referring to FIGS. 14 to 16, 19A and 19B, and 20C, the semiconductor manufacturing process in accordance with an embodiment may include performing the processes described in S105 to S150 of FIG. 20A, performing an X-moving operation and a Y-moving operation to move the wafer stage 76 in an X-direction and a Y-direction to align a first region of a surface of the wafer W with the UV illumination area 15a (S161), moving the wafer stage 76 up or down based on a Z-moving correction value $\Delta Z1$ to level the first region of the surface of the wafer W at the same level as the UV illumination area 15 (S166), performing a first unit surface treatment process with respect to the first region of the surface of the wafer W (S171), selectively performing the X-moving operation or the Y-moving operation to move the wafer stage 76 to be aligned the second region of the surface of the wafer W with the UV illumination area 15, (S176), moving up or down based on a Z-moving correction value $\Delta Z2$ in the second region to level the second region of the surface of the wafer W at the UV illumination area 15 (S181), performing a second unit surface treatment process with respect to the second region of the surface of the wafer W (S186), repeatedly performing S176 to S186 to complete the surface treatment process with respect to the entire surface of the wafer W (S191), and transferring the wafer W to a subsequent process (S196).

The process controller 600 may calculate the rotation moving value $\Delta\Phi$ and the Z-moving correction value $\Delta Z$ based on the surface level of the wafer W using a computer. The process controller 600 may calculate separate or independent warpage correction data (coordinate map) and X-moving correction data (coordinate map) based on the calculated rotation moving value $\Delta\Phi$ and the Z-moving correction value $\Delta Z$ based on the surface level of the wafer W. The warpage correction data (coordinate map) and the X-moving correction data (coordinate map) may be generated to have independent correction values for each die D in the wafer W.

The first region and the second region of the wafer W may be regions exposed to light at the same time during the surface treatment process, respectively. For example, all the dies D in the first region of the wafer W may be simultaneously exposed to light, and all the dies D in the second region of the wafer W may be simultaneously exposed to light.

Referring to FIGS. 17A and 17B, the first region and the second region of the wafer W, and the UV illumination area 15 may be bar-shaped or line shaped. The UV illumination area 15 may have a length greater than the diameter of the wafer W.

During the primary surface treatment process and the secondary surface treatment process, the Z-moving operation of the wafer stage 76 may be performed. For example, the first region and/or the second region may repeatedly move the wafer stage 76 up or down, respectively, and may be exposed plural times. Exposure to the light plural times may include turning on/off the light source 10a or performing the Y-scanning operation.

In example embodiments, light energy may be uniformly supplied to material layers formed on a wafer in an ALD process for manufacturing semiconductor devices. In accordance with embodiments, the heat treatment of the ALD process for manufacturing a semiconductor device may be performed using a UV light, and the thermal budget of the semiconductor device may be reduced. In accordance with embodiments, the deposition process and the surface treatment process of the ALD process for fabricating a semiconductor device may be performed at the same time, so that the productivity may be increased.

Embodiments relate to ALD apparatus and methods of fabricating semiconductor devices using the same. Embodiments may provide an ALD apparatus for fabricating semiconductor devices. Embodiments may provide a surface treatment apparatus for fabricating semiconductor devices. Embodiments may provide methods of fabricating semiconductor devices using the ALD apparatuses and/or the surface treatment apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An atomic layer deposition (ALD) apparatus, comprising:
    a light source disposed at an upper portion of a section;
    a wafer supporting part disposed at a lower portion of the section, the wafer supporting part being spaced apart from the light source in a vertical direction; and
    a lens pocket located between the light source and the wafer supporting part in the vertical direction, and including a frame part and a transparent panel, wherein;
    the frame part has sides that define a pocket space, and the transparent panel defines a bottom of the pocket space,
    the frame part includes an air inlet that extends in the vertical direction so as to vertically penetrate the frame part, and
    the frame part includes an air outlet that extends in the vertical direction so as to vertically penetrate the frame part.

2. The ALD apparatus as claimed in claim 1, wherein the pocket space has a rectangular trough shape.

3. The ALD apparatus as claimed in claim 1, further comprising an upper panel having a flat upper surface, wherein the lens pocket is disposed at a center of the upper panel.

4. The ALD apparatus as claimed in claim 3, wherein:
    the upper panel is disposed at a relatively high level, and
    the transparent panel is disposed at a relatively low level.

5. The ALD apparatus as claimed in claim 1, wherein the frame part includes cooling holes disposed along the rectangular shape.

6. The ALD apparatus as claimed in claim 5, wherein at least one of the cooling holes is disposed at a same horizontal level as the transparent panel.

7. The ALD apparatus as claimed in claim 1, wherein:
    the air inlet penetrates a first portion of the frame part, and
    the air outlet penetrates a second portion of the frame part.

8. The ALD apparatus as claimed in claim 7, wherein the first portion is a first half of the frame part, and the second portion is a second half of the frame part opposite to the first half.

9. The ALD apparatus as claimed in claim 7, wherein a lower edge of the frame part has a curved surface.

10. The ALD apparatus as claimed in claim 9, wherein the lower edge of the frame part includes an upper negative curved surface and a lower positive curved surface.

11. The ALD apparatus as claimed in claim 10, wherein a lower portion of the air inlet is disposed on the upper negative curved surface.

12. The ALD apparatus as claimed in claim 10, wherein a lowermost portion of the lower edge of the frame part has a downwardly convex shape.

13. The ALD apparatus as claimed in claim 10, wherein the lower positive curved surface has a first positive curved surface having a first curvature radius and a second positive curved surface having a second curvature radius different from the first curvature radius.

14. The ALD apparatus as claimed in claim 1, wherein:
    the wafer supporting part includes a wafer stage to mount a wafer thereon,
    the frame part has an inwardly directed flange that supports a lower surface of the transparent panel,
    a bottommost surface of the flange, which faces the wafer stage, is a positive curved surface that is connected to a negative curved surface, and
    the positive curved surface is a surface of the frame part that is located closest to the wafer stage.

15. The ALD apparatus as claimed in claim 1, further comprising a lens disposed in the pocket space, wherein,
    the lens is a bar-shape cylindrical convex lens, and
    the lens is configured to focus light from the light source into a linear focus line.

16. The ALD apparatus as claimed in claim 1, wherein the wafer supporting part includes:
    a wafer stage to mount a wafer thereon, the wafer stage being moveable in a horizontal direction; and
    an up-down lift below the wafer stage, the up-down lift being moveable to move the wafer stage up and down in the vertical direction.

17. The ALD apparatus as claimed in claim 15, wherein the light source has a bar-shape illumination area.

18. An atomic layer deposition (ALD) apparatus, comprising:
    a light source;
    a wafer stage; and
    a pocket module between the light source and the wafer stage, the pocket module including a lens pocket having a frame part and a transparent panel disposed below the frame part, wherein;
    a bottommost surface of the frame part, which faces the wafer stage, is a positive curved surface connected to a negative curved surface,
    the positive curved surface is a surface of the frame part that is located closest to the wafer stage, and
    the frame part includes an air inlet that extends in a vertical direction so as to vertically penetrate the negative curved surface.

19. An atomic layer deposition apparatus, comprising:
a light source;
a wafer stage; and
a pocket module between the light source and the wafer stage, the pocket module including:
an upper panel having a flat surface; and
a lens pocket disposed at a center of the upper panel, the lens pocket including a frame part and a transparent panel, wherein;
the wafer stage is spaced apart from the light source in a vertical direction,
the frame part has a plurality of air inlet holes that extend in the vertical direction so as to vertically penetrate the frame part, and
the frame part has a slit-shaped air outlet that extends in the vertical direction so as to vertically penetrate the frame part.

20. The ALD apparatus as claimed in claim 19, wherein:
the frame part has a bottom surface, which faces the wafer stage, that includes a first curved surface, a second curved surface, a third curved surface, and a fourth curved surface,
the first, second, third, and fourth curved surfaces are connected in sequence, with the second curved surface connecting the first curved surface to the third curved surface, and the third curved surface connecting the second curved surface to the fourth curved surface,
the second and third curved surfaces are convex surfaces in a vertical cross-section of the frame part, and the first and fourth curved surfaces are concave surfaces in the vertical cross-section of the frame part, and
the plurality of air inlet holes vertically penetrate the frame part such that open ends of the plurality of air inlet holes are located in the first curved surface.

* * * * *